(12) United States Patent
Okamoto et al.

(10) Patent No.: US 9,269,803 B2
(45) Date of Patent: Feb. 23, 2016

(54) SEMICONDUCTOR DEVICE

(71) Applicant: Renesas Electronics Corporation, Kawasaki-shi, Kanagawa (JP)

(72) Inventors: Yasuhiro Okamoto, Kanagawa (JP); Takashi Inoue, Kanagawa (JP); Tatsuo Nakayama, Kanagawa (JP); Ryohei Nega, Kanagawa (JP); Masaaki Kanazawa, Kanagawa (JP); Hironobu Miyamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/937,846

(22) Filed: Jul. 9, 2013

(65) Prior Publication Data

US 2014/0015019 A1  Jan. 16, 2014

(30) Foreign Application Priority Data

Jul. 12, 2012  (JP) .................. 2012-156891

(51) Int. Cl.

| H01L 29/78 | (2006.01) |
|---|---|
| H01L 21/8252 | (2006.01) |
| H01L 29/66 | (2006.01) |
| H01L 29/778 | (2006.01) |
| H01L 29/51 | (2006.01) |
| H01L 29/20 | (2006.01) |

(52) U.S. Cl.
CPC .......... *H01L 29/78* (2013.01); *H01L 29/66462* (2013.01); *H01L 29/7787* (2013.01); *H01L 29/2003* (2013.01); *H01L 29/517* (2013.01); *H01L 29/518* (2013.01); *H01L 2924/0002* (2013.01)

(58) Field of Classification Search
CPC ... H01L 29/78; H01L 29/7783; H01L 29/517; H01L 29/7787; H01L 29/66462; H01L 29/4232; H01L 29/4966; H01L 29/452; H01L 27/0605; H01L 27/0629; H01L 29/872; H01L 29/7788; H01L 29/41758; H01L 29/42316; H01L 21/8252; H01L 27/0207; H01L 29/8124
See application file for complete search history.

(56) References Cited

U.S. PATENT DOCUMENTS

| 5,304,822 A | 4/1994 | Takagi et al. |
| 8,344,463 B2 | 1/2013 | Yanagihara et al. |
| 8,653,565 B1 * | 2/2014 | Vorhaus ..................... 257/213 |
| 8,748,995 B2 | 6/2014 | Kaibara et al. |
| 2004/0135169 A1 * | 7/2004 | Yoshii et al. .............. 257/107 |

(Continued)

FOREIGN PATENT DOCUMENTS

| JP | 60-198862 A | 10/1985 |
| JP | 4-010474 A | 1/1992 |

(Continued)

*Primary Examiner* — Jarrett Stark
*Assistant Examiner* — Bitew Dinke
(74) *Attorney, Agent, or Firm* — Foley & Lardner LLP

(57) ABSTRACT

The reliability of a field effect transistor made of a nitride semiconductor material is improved. An ohmic electrode includes a plurality of unit electrodes isolated to be separated from each other. With this configuration, an on-state current can be prevented from flowing in the unit electrodes in a y-axial direction (negative direction). Further, in the respective unit electrodes, a current density of the on-state current flowing in the y-axial direction (negative direction) can be prevented from increasing. As a result, an electromigration resistance of the ohmic electrode can be improved.

20 Claims, 32 Drawing Sheets

(56) References Cited

U.S. PATENT DOCUMENTS

| | | | |
|---|---|---|---|
| 2007/0181934 A1* | 8/2007 | Hu et al. | 257/315 |
| 2007/0228424 A1* | 10/2007 | Igarashi | 257/256 |
| 2008/0093626 A1* | 4/2008 | Kuraguchi | 257/190 |
| 2009/0050900 A1* | 2/2009 | Masuda | 257/77 |
| 2009/0146186 A1* | 6/2009 | Kub et al. | 257/194 |
| 2010/0237437 A1* | 9/2010 | Takagi | 257/401 |
| 2011/0204418 A1* | 8/2011 | Onishi et al. | 257/194 |
| 2011/0309372 A1* | 12/2011 | Xin | H01L 27/0605 257/76 |
| 2012/0086497 A1* | 4/2012 | Vorhaus | 327/427 |
| 2012/0217542 A1* | 8/2012 | Morita | 257/140 |
| 2012/0217591 A1* | 8/2012 | Kamada | 257/410 |
| 2012/0256193 A1* | 10/2012 | Hebert et al. | 257/77 |
| 2013/0026485 A1* | 1/2013 | Hur et al. | 257/76 |
| 2013/0043487 A1* | 2/2013 | Liu et al. | 257/76 |
| 2013/0062625 A1* | 3/2013 | Takada | 257/77 |
| 2013/0087858 A1* | 4/2013 | Yanagihara et al. | 257/368 |
| 2013/0119486 A1* | 5/2013 | Kaibara et al. | 257/411 |
| 2013/0146891 A1* | 6/2013 | Xin et al. | 257/76 |
| 2013/0161641 A1* | 6/2013 | Kub et al. | 257/76 |
| 2013/0176013 A1* | 7/2013 | Takemae et al. | 323/311 |
| 2013/0214330 A1* | 8/2013 | Briere et al. | 257/194 |
| 2013/0221409 A1* | 8/2013 | Nakajima et al. | 257/194 |
| 2013/0299878 A1* | 11/2013 | Briere et al. | 257/194 |

FOREIGN PATENT DOCUMENTS

| | | |
|---|---|---|
| JP | 7-45829 A | 2/1995 |
| JP | 3086713 B2 | 9/2000 |
| JP | 2010-103158 A | 5/2010 |
| JP | 2012-023074 A | 2/2012 |
| WO | WO 2012008075 * | 1/2012 |

* cited by examiner

SEMICONDUCTOR DEVICE

CROSS-REFERENCE TO RELATED APPLICATIONS

The disclosure of Japanese Patent Application No. 2012-156891 filed on Jul. 12, 2012 including the specification, drawings and abstract is incorporated herein by reference in its entirety.

BACKGROUND

The present invention relates to a semiconductor device, and, for example, to a technique that is effectively applied to a semiconductor device including a power device made of a nitride semiconductor material.

Japanese Unexamined Patent Application Publication No. Hei7 (1995)-45829 discloses a configuration in which a plurality of contact holes is connected to a metal wiring portion in a drain diffusion region, and the plurality of contact holes is also connected to a metal wiring portion in a source diffusion region.

Also, Japanese Patent No. 3086713 discloses a technique in which a plurality of source contact regions that joins a source electrode to a nondivided source region is provided.

SUMMARY

Nowadays, higher-efficient use of energy in preparation for a low carbon society represents an important and prompt issue. In order to use the high efficiency of energy, for example, because the effect of reducing a power loss in an inverter contributes to the high efficiency of the energy, it is important to develop the power device configuring the inverter. In the research and development status, as a material of the power device, a change from Si (silicon) to GaN (gallium nitride) has been considered. This is because there can be provided a power device of a high performance which can perform both of a reduction in an on resistance and a withstand voltage with the use of GaN (gallium nitride) since GaN (gallium nitride) is larger in breakdown field intensity and band gap than Si (silicon).

However, because the power device deals with a large current, for example, when an ohmic electrode that comes in ohmic contact with a nitride semiconductor layer is used, a current density flowing in the ohmic electrode becomes large. For that reason, a risk that an electromigration occurring in the ohmic electrode leads to the generation of voids and disconnection is increased.

The other problems and novel features will become apparent from the description of the present specification and the attached drawings.

According to an aspect of the present invention, there is provided a field effect transistor including a first ohmic electrode having a plurality of first unit electrodes that comes in ohmic contact with a nitride semiconductor layer, and is separated from each other. Further, the electric field transistor according to the aspect of the present invention includes a second ohmic electrode having a plurality of second unit electrodes that comes in ohmic contact with the nitride semiconductor layer, and is separated from each other, in which the second ohmic electrode is separated from the first ohmic electrode. The plurality of first unit electrodes and the plurality of second unit electrodes each include an aluminum film.

According to the aspect of the present invention, the reliability of the field effect transistor using a nitride semiconductor material can be improved.

DETAILED DESCRIPTION

Figure 1:
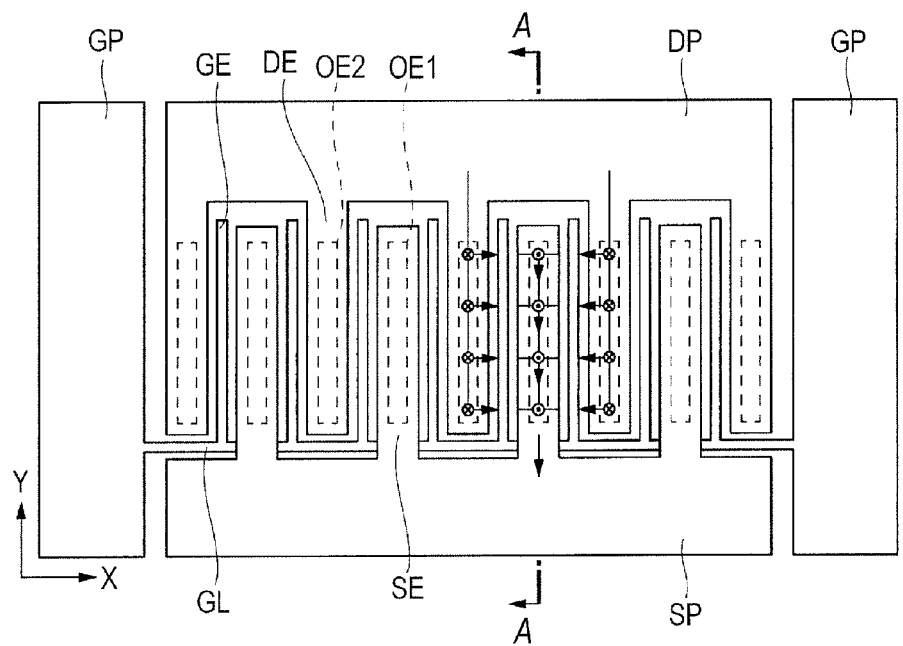
FIG. 1 is a plan view illustrating a configuration example of a power MOSFET in a related art.

The following embodiments are divided into a plurality of sections and embodiments, when necessary for the sake of convenience. Therefore, unless clearly indicated otherwise, the divided sections or embodiments are not irrelevant to one another, but one section or embodiment has a relation of modifications, details and supplementary explanations to some or all of the other embodiments.

In addition, in the following embodiments, when the number (including count, figure, amount, and range) of the components is mentioned, the number of components is not limited to a specific number and may be greater than, less than or equal to the specific number, unless clearly specified otherwise and definitely limited to the specific number in principle.

Furthermore, there is no need to say that, in the following embodiments, the components (including component steps, etc.) are not always essential, unless clearly specified otherwise and considered to be definitely essential in principle.

Similarly, when shapes and positional relationships, etc. of the components are mentioned in the following embodiments, the components will have shapes substantially analogous or similar to their shapes or the like, unless clearly defined otherwise and considered not to be definite in principle. This is applied likewise to the above-described numerical values and ranges as well.

In addition, in all the drawings for explaining the embodiments, the same components are indicated by the same reference numerals in principle, and so a repeated description thereof will be omitted. Also, hatching may be used even in plan views to make it easy to read the drawings.

First Embodiment
(Description of Related Art)

First, before a semiconductor device according to a first embodiment will be described, a semiconductor device in a related art will be described. Then, after a room for improvement in the related art is described, a technical concept of the first embodiment will be described.

FIG. 1 is a plan view illustrating a configuration example of a power MOSFET (Metal Oxide Semiconductor Field Effect Transistor) in a related art. As illustrated in FIG. 1, in the power MOSFET of the related art, gate pads GP are each arranged on a left end and a right end of a paper plane, and source electrodes SE and drain electrodes DE are arranged between the gate pads GP arranged on the right and left sides. More specifically, a source pad SP extending in an X-axial direction is interposed between the gate pads GP arranged on the right and left sides, and the plurality of comb-shaped source electrodes SE is formed to protrude from the source pad SP in a Y-axial direction.

Likewise, a drain pad DP extending in the X-axial direction is arranged in a space between the gate pads GP disposed on the right and left sides, and the plurality of comb-shaped drain electrodes DE is formed to protrude from the drain pad DP in the Y-axial direction.

The plurality of source electrodes SE and the plurality of drain electrodes DE are alternately arranged in the X-axial direction orthogonal to the Y-axial direction. In this case, a plurality of gate electrodes GE extending in the Y-axial direction are arranged between the respective source electrodes SE and the respective drain electrodes DE, which are alternately arranged. The gate electrodes GE are electrically connected to a gate line GL that is juxtaposed in proximity to the source pad SP, and the gate line GL extending in the X-axial direction is electrically connected to the gate pads GP arranged on the right and left sides of the paper plane.

Further, in the power MOSFET of the related art, a single ohmic electrode OE1 is formed over a lower layer of the source electrodes SE, and the ohmic electrode OE1 is arranged to extend in the Y-axial direction. The ohmic electrode OE1 is electrically connected to the source electrodes SE formed over an upper layer thereof.

Likewise, a single ohmic electrode OE2 is formed over a lower layer of the drain electrodes DE, and the ohmic electrode OE2 is arranged to extend in the Y-axial direction. The ohmic electrode OE2 is electrically connected to the drain electrodes DE formed over an upper layer thereof.

Figure 2:
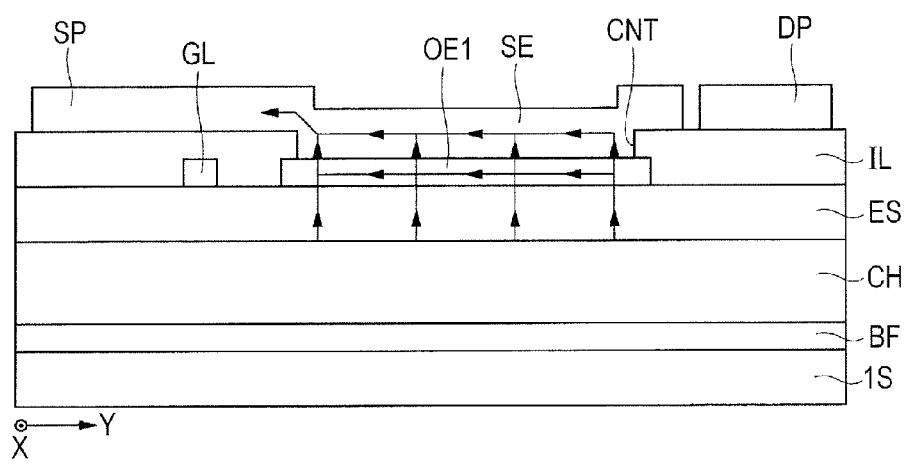
FIG. 2 is a cross-sectional view taken along a line A-A in FIG. 1.

FIG. 2 is a cross-sectional view taken along a line A-A in FIG. 1. As illustrated in FIG. 2, in the power MOSFET of the related art, a buffer layer BF is formed over a semiconductor substrate 1S made of, for example, silicon, and a channel layer CH made of, for example, GaN is formed over the buffer layer BF. An electron supply layer ES made of, for example, AlGaN is formed over the channel layer CH.

In this example, the buffer layer BF is formed for the purpose of reducing mismatching between lattice spacing of Silicon (Si) configuring the semiconductor substrate 1S and lattice spacing of gallium nitride (GaN) configuring the channel layer CH. That is, when the channel layer CH made of gallium nitride (GaN) is formed directly on the semiconductor substrate 1S made of silicon, a large number of crystal defects are formed in the channel layer CH, to thereby lead to a performance degradation of the power MOSFET. For that reason, the buffer layer BF is inserted for the purpose of reducing lattices between the semiconductor substrate 1S and the channel layer CH. With the formation of the buffer layer BF, the quality of the channel layer CH formed over the buffer layer BF can be improved. As a result, the performance of the power MOSFET can be improved.

Subsequently, as illustrated in FIG. 2, the gate line GL and the ohmic electrode OE1 are formed over the electron supply layer ES, and an interlayer insulating film IL formed of, for example, a silicon oxide film is formed to cover the gate line GL and the ohmic electrode OE1. A contact hole CNT is formed in the interlayer insulating film IL to expose a surface of the ohmic electrode OE1, and the source electrode SE is embedded in the contact hole CNT and formed over the interlayer insulating film IL. Further, the source pad SP is formed integrally with the source electrodes SE over the interlayer insulating film IL, and the drain pad DP is formed over the interlayer insulating film IL which is distant from the source pad SP.

In the power MOSFET thus configured in the related art, a development using a compound semiconductor process goes ahead, but in order to realize a reduction in the costs, the establishment of a mass production technology in a silicon semiconductor process is demanded.

For example in the compound semiconductor process, a laminated film including Ti, Al, Mo, and Au from a lower layer in the stated order is used for the ohmic electrode OE1 that comes in ohmic contact with a nitride semiconductor layer, and a gold (Au) wire is used for a wire (for example, source electrode SE) that is electrically connected to the ohmic electrode OE1.

Accordingly when a power device made of a nitride semiconductor material is manufactured in the compound semiconductor process, the manufacturing costs rise because expensive gold (Au) is frequently used. On the other hand, in the silicon semiconductor process, because the expensive gold is not usually used for the interconnect layers, the manufacturing costs can be reduced.

When the silicon semiconductor process is used, because there is a need to suppress the diffusion of gold atoms, the ohmic electrode OE1 needs to be made of a material instead of the ohmic electrode OE1 including a gold film. For example, it is conceivable that an aluminum film exemplifies a metal material that comes in ohmic contact with the nitride semiconductor layer, and the ohmic electrode OE1 mainly containing the aluminum film therein is used in the silicon semiconductor process. In particular, the present inventors have found that when the electron supply layer ES is made of AlGaN, and the ohmic electrode is made of aluminum, since a work function of AlGaN and a work function of aluminum relatively approach each other, an excellent ohmic contact can be formed.

However, according to the present inventors' study, when the ohmic electrode OE1 is formed of the aluminum film, it is found that a room of improvement which will be described below is actualized, which will be described.

(Room for Improvement Present in the Related Art)

A path of a current flowing when the power MOSFET is on in the related art will be described with reference to FIGS. 1 and 2. First, as illustrated in FIG. 1, when the power MOSFET is on, an on-state current flows into the drain electrodes DE from the drain pad DP. Then, the on-state current that has reached the drain electrodes DE arrives at an interface between the channel layer CH and the electron supply layer ES through the ohmic electrode OE2 formed over the lower layer of the drain electrodes DE.

In this example, in the power MOSFET of the related art using the nitride semiconductor material, two dimensional electron gas is generated in the vicinity of the interface between the channel layer CH and the electron supply layer ES in the channel layer CH. The two dimensional electron gas is generated by the following mechanism. Since an electron affinity of gallium nitride (GaN) configuring the channel layer CH and an electron affinity of aluminum gallium nitride (AlGaN) configuring the electron supply layer ES are different from each other, a conduction band offset (conduction band discontinuity) is formed. A square well potential lower than a Fermi level is generated in the vicinity of the interface between the channel layer CH and the electron supply layer ES in the channel layer CH due to an influence the conduction band offset, and a piezoelectric polarization and spontaneous polarization which are present in the channel layer CH and the electron supply layer ES. As a result, electrons are accumulated in the square well potential. With this configuration, the two dimensional electron gas is generated in the vicinity of the interface between the channel layer CH and the electron supply layer ES.

Accordingly, as illustrated in FIG. 1, with the two dimensional electron gas generated in the interface between the channel layer CH and the electron supply layer ES, the on-state current flows along the interface between the channel layer CH and the electron supply layer ES, from a lower layer of the ohmic electrode OE2 toward a lower layer of the ohmic electrode OE1 through immediately below the gate electrodes. Thereafter, as illustrated in FIG. 2, the on-state current that has reached the lower layer of the ohmic electrode OE1 flows into the ohmic electrode OE1 formed over the upper layer of the electron supply layer ES, and the source electrodes SE formed over the ohmic electrode OE1, and finally arrives at the source pad SP. In this way, in the power MOSFET of the related art, the on-state current flows from the drain pad DP into the source pad SP.

In this situation, as illustrated in FIG. 2, since the ohmic electrode OE1 is configured by a single electrode, and extends in the Y-axial direction, a part of the on-state current flows into the ohmic electrode OE1 in the Y-axial direction. That is, a part of the on-state current flows along a longitudinal direction of the ohmic electrode OE1. Likewise, as illustrated in FIG. 1, a part of the on-state current flows into not only the ohmic electrode OE1, but also the ohmic electrode OE2 along a longitudinal direction of the ohmic electrode OE2.

For example, when attention is paid to the ohmic electrode OE1 illustrated in FIG. 2, a part of the on-state current continues to flow from the right side toward the left side (in a longitudinal direction) illustrate in FIG. 2. Because a large current is used in the power MOSFET, a current density flowing in the longitudinal direction of the ohmic electrode OE1 becomes large in the power MOSFET of the related art. Under the above conditions, when the aluminum film is used for the ohmic electrode OE1, electromigration is actualized. That is, because the aluminum film has a characteristic that the electromigration is liable to be generated when a current density of the current flowing into the film increases, when the aluminum film is used as the ohmic electrode OE1, there is a risk that the electromigration is generated in the aluminum film, thereby inducing disconnection of the ohmic electrode OE1.

The disconnection of the ohmic electrode OE1 is thus induced, the power MOSFET comes to a defect. That is, when the density of current flowing into the aluminum film becomes higher, there occurs the electromigration which is phenomenon that aluminum atoms obtain a momentum due to an electron flow, and migrates toward a downstream side. When the electromigration is generated, voids are generated within the aluminum film to cause the disconnection, or a hillock is generated downstream of the electron flow to degrade the reliability. Accordingly, in the above-mentioned related art, when the ohmic electrode OE1 and the ohmic electrode OE2 are each formed of the aluminum film, it is found that there is a room for improvement from the viewpoint of the reliability of the power MOSFET.

Under the circumstances, the first embodiment is configured with an improvement in the above-mentioned related art. Hereinafter, a description will be given of a technical concept of the first embodiment thus configured.

(Configuration of Semiconductor Device According to First Embodiment)

Figure 3:
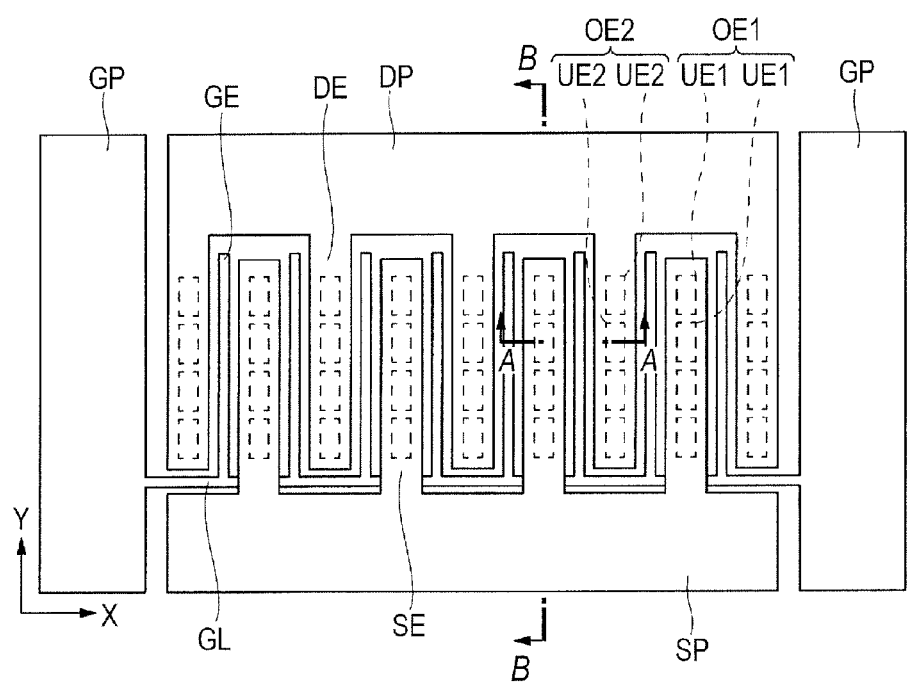
FIG. 3 is a plan view illustrating a configuration example of a power MOSFET according to a first embodiment.

FIG. 3 is a plan view illustrating a configuration example of a power MOSFET (semiconductor device) according to the first embodiment. As illustrated in FIG. 3, in the power MOSFET according to the first embodiment, gate pads GP are each arranged on the right end and the left end of the paper plane, and the source electrodes SE and the drain electrodes DE are arranged between the gate pads GP arranged on the right and left sides. More specifically, the source pad SP extending in the X-axial direction is arranged to be interposed between the gate pads GP arranged on the right and left sides, and the plurality of the comb-shaped source electrodes (source comb-shaped electrodes) SE are formed to protrude from the source pad SP in the Y-axial direction.

Likewise, the drain pad DP extending in the X-axial direction is arranged in a space between the gate pads GP disposed on the right and left sides, and the plurality of comb-shaped drain electrodes (drain comb-shaped electrodes) DE is formed to protrude from the drain pad DP in the Y-axial direction.

The plurality of source electrodes SE and the plurality of drain electrodes DE are alternately arranged in the X-axial direction orthogonal to the Y-axial direction. In this case, a plurality of gate electrodes GE extending in the Y-axial direction are arranged between the respective source electrodes SE and the respective drain electrodes DE, which are alternately arranged. The plurality of gate electrodes GE are electrically connected to a gate line GL that is juxtaposed in proximity to the source pad SP, and the gate line GL extending in the X-axial direction is electrically connected to the gate pads GP arranged on the right and left sides of the paper plane.

Further, in the power MOSFET of the first embodiment, an ohmic electrode OE1 is formed over a lower layer of the source electrodes SE. The ohmic electrode OE1 is configured by a plurality of unit electrodes UE1, and the plurality of unit electrodes UE1 are aligned in the Y-axial direction to form the ohmic electrode OE1. Each of the unit electrodes UE1 configuring the ohmic electrode OE1 is electrically connected to the source electrodes SE formed over an upper layer thereof.

Likewise, an ohmic electrode OE2 is formed over a lower layer of the drain electrodes DE. The ohmic electrode OE2 is configured by a plurality of unit electrodes UE2. The unit electrodes UE1 are aligned in the Y-axial direction to form the ohmic electrode OE2. Each of the unit electrodes UE2 configuring the ohmic electrode OE2 is electrically connected to the drain electrodes DE formed over an upper layer thereof.

In the first embodiment, a width of the source electrodes SE in the X-axial direction is equal to a width of the drain electrodes DE in the X-axial direction. The number of unit electrodes UE1 formed over the lower layer of the source electrodes SE is equal to the number of unit electrodes UE2 formed over the lower layer of the drain electrodes DE. Because a source current and a drain current are substantially identical in current value with each other, it is desirable that the number of unit electrodes UE1 is the same as the number of unit electrodes UE2 from the viewpoint of suppressing the electromigration. However, particularly in an intended purpose of decreasing a source resistance, the number of unit electrodes UE1 can be reduced more than the number of unit electrodes UE2. Thus, the number of unit electrodes UE1 can differ from the number of unit electrodes UE2 depending on the intended purpose.

Figure 4:
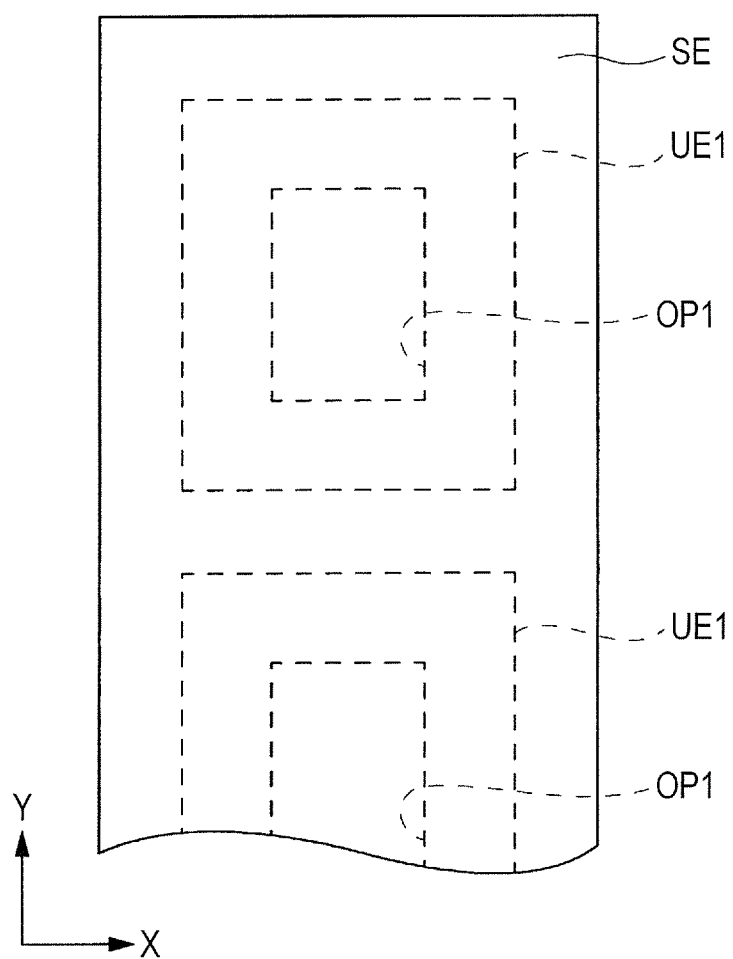
FIG. 4 is a partially enlarged plan view of a source electrode illustrated in FIG. 3.

FIG. 4 is a partially enlarged plan view of the source electrode SE illustrated in FIG. 3. As illustrated in FIG. 4, an interlayer insulating film (not shown) is formed over the lower layer of the source electrodes SE formed into rectangular shape, and the plurality of unit electrodes UE1 are formed through opening portions OP1 formed in the interlayer insulating film. In this case, each of the unit electrodes UE1 and each of the opening portions OP1 are formed into a rectangular shape, and the plurality of unit electrodes UE1 are formed to be included by the source electrode SE in a plan view. Further, the opening portions OP1 are formed to be included by the unit electrodes UE1 in the plan view. That is, a size of the unit electrodes UE1 is smaller than a size of the source electrodes SE, and larger than a size of the opening portion OP1. This configuration is applied to not only a relationship of the source electrodes SE, the opening portions OP1, and the unit electrodes UE1, but also a relationship of the drain electrodes DE, the opening portions (not shown), and the unit electrodes UE2 illustrated in FIG. 3.

Thus, in the first embodiment, in a direction (X-axial direction) along which the plurality of unit electrodes UE1 are aligned, each width of the unit electrodes UE1 is larger than each width of the opening portions (first opening portions) OP1. Likewise, in a direction (X-axial direction) along which the plurality of unit electrodes UE2 are aligned, each width of the unit electrodes UE2 is larger than each width of the opening portions (second opening portions). In the plan view, each of the opening portions OP1 is included in each of the unit electrodes UE1, and in the plan view, each of the plurality of opening portions is included in each of the plurality of unit electrodes UE2.

Figure 5:
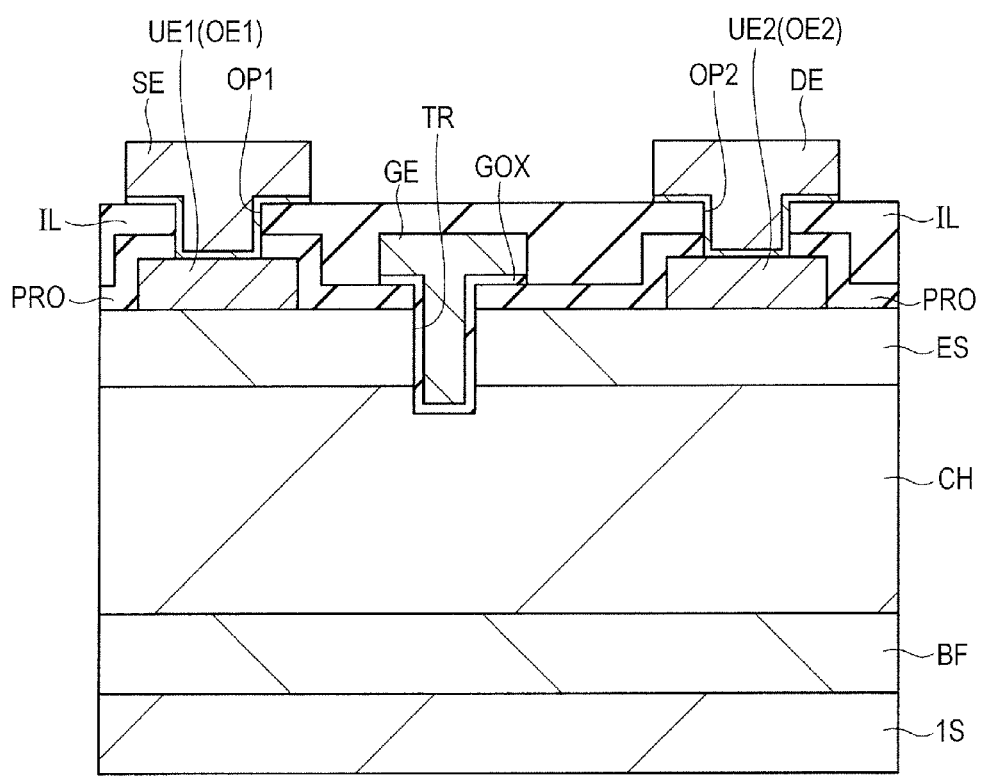
FIG. 5 is a cross-sectional view taken along a line A-A in FIG. 3.

FIG. 5 is a cross-sectional view taken along a line A-A in FIG. 3. As illustrated in FIG. 5, in the power MOSFET of the first embodiment, for example, the buffer layer BF is formed over the semiconductor substrate 1S made of, for example, silicon, and the channel layer CH made of, for example, GaN is formed over the buffer layer BF. The electron supply layer ES made of, for example, AlGaN is formed over the channel layer CH.

In this example, the buffer layer BF is formed for the purpose of reducing mismatching between lattice spacing of Silicon (Si) configuring the semiconductor substrate 1S and lattice spacing of gallium nitride (GaN) configuring the channel layer CH. That is, when the channel layer CH made of gallium nitride (GaN) is formed directly on the semiconductor substrate 1S made of silicon, a large number of crystal defects are formed in the channel layer CH, to thereby lead to a performance degradation of the power MOSFET. For that reason, the buffer layer BF is inserted for the purpose of reducing lattices between the semiconductor substrate 1S and the channel layer CH. With the formation of the buffer layer BF, the quality of the channel layer CH formed over the buffer layer BF can be improved. As a result, the performance of the power MOSFET can be improved.

In the first embodiment, an example in which the semiconductor substrate 1S is made of silicon (Si) is described. However, the present invention is not limited to this example, but the substrate may be made of silicon carbide (SiC), sapphire ($Al_2O_3$), Gallium nitride (GaN), or diamond (C).

Subsequently, as illustrated in FIG. 5, in the power MOSFET of the first embodiment, there is formed a trench (groove) TR that exceeds an interface between the electron supply layer ES and the channel layer CH from a surface of the electron supply layer ES, and reaches the channel layer CH. A gate insulating film GOX formed of, for example, a silicon oxide film or an aluminum oxide film is formed on an inner wall of the trench TR, and the gate electrodes GE is embedded within the trench TR through the gate insulating film GOX.

Also, as illustrated in FIG. 5, each unit electrode UE1 and each unit electrode UE2 are formed over the electron supply layer ES, and a protective film PRO formed of, for example, a silicon oxide film, and an interlayer insulating film IL are formed to cover the unit electrode UE1 and the unit electrode UE2. In the protective film PRO and the interlayer insulating film IL, the opening portion OP1 is formed to expose a surface of the unit electrode UE1, and an opening portion OP2 is formed to expose a surface of the unit electrode UE2. Each source electrode SE is formed over the interlayer insulating film IL from an interior of the opening portion OP1. Likewise, each drain electrode DE is formed over the interlayer insulating film IL from an interior of the opening portion OP2. In this situation, the unit electrode UE1 and the unit electrode UE2 are each formed of an aluminum film, and the source electrode SE and the drain electrode DE are each formed of a laminated film including, for example, a barrier conductor film formed of a titanium/titanium nitride film, and an aluminum alloy film represented by an AlCu film or an AlSiCu film.

In the power MOSFET of the first embodiment using the nitride semiconductor material thus configured, the two dimensional electron gas is generated in the vicinity of the interface between the channel layer CH and the electron supply layer ES. That is, the square well potential lower than the Fermi level is generated in the vicinity of the interface between the channel layer CH and the electron supply layer ES due to an influence of the conduction band offset based on a difference in the electron affinity between the channel layer CH and the electron supply layer ES, and the piezoelectric polarization and the spontaneous polarization existing in the channel layer CH and the electron supply layer ES. As a result, electrons are accumulated within the square well potential whereby the two dimensional electron gas is generated in the vicinity of the interface between the channel layer CH and the electron supply layer ES.

The reason why the trench TR in which the gate electrode GE is embedded exceeds the interface between the channel layer CH and the electron supply layer ES, and reaches the channel layer CH is as follows. For example, when the gate electrode GE is arranged over the electron supply layer ES, the two dimensional electron gas is generated in the interface between the channel layer CH and the electron supply layer ES immediately below the gate electrode GE even in a state where no voltage is applied to the gate electrode GE. That is, even in the state where no voltage is applied to the gate electrode GE, when a potential difference occurs between the drain electrode DE and the source electrode SE, a normally on-state in which the on-state current flows is obtained.

That is, when the channel layer CH and the electron supply layer ES are made of nitride semiconductor, a bottom of the square well potential is pushed down due to the piezoelectric polarization and the spontaneous polarization caused by using the nitride semiconductor in addition to the square well potential caused by the conduction band offset between the channel layer CH and the electron supply layer ES. As a result, when the gate electrodes GE have no trench structure, even if no voltage is applied to the gate electrodes GE, the two dimensional electron gas is generated in the vicinity of the interface between the channel layer CH and the electron supply layer ES. As a result, the device becomes a normally-on type.

Incidentally, in a power control transistor represented by the power MOSFET, the normally-on device is required. For that reason, as illustrated in FIG. 5, the power MOSFET having a structure in which the gate electrode GE is embedded in the trench TR is proposed.

In the power MOSFET having the gate electrode GE of the above trench structure, the interface between the channel layer CH and the electron supply layer ES is interrupted by the gate electrode GE of the trench structure. For that reason, if the voltage to be applied to the gate electrodes GE is equal to or lower than a threshold voltage, there is no conduction between the source electrodes SE and the drain electrodes DE due to the two dimensional electron gas.

On the other hand, in the power MOSFET of the first embodiment, when a voltage equal to or higher than the threshold voltage is applied to the gate electrodes GE, electrons are collected in the vicinity of a bottom surface of the gate electrodes GE to form an accumulation region due to a positive voltage applied to the gate electrodes GE. As a result, when the voltage equal to or higher than the threshold voltage is applied to the gate electrodes GE, a conduction between the source electrodes SE and the drain electrodes DE is performed by the two dimensional electron gas and the accumulation region. As a result, an on-state current flows from the drain electrodes DE toward the source electrodes SE. In other words, electrons flow from the source electrodes SE toward the drain electrodes DE. In this way, in the power MOSFET configured as illustrated in FIG. 5, the normally-off device can be realized. That is, the gate electrodes GE of the trench structure are applied for the purpose of realizing the normally-off device.

As illustrated in FIG. 5, the unit electrode UE1 and the unit electrode UE2 are formed over the electron supply layer ES. The electron supply layer (nitride semiconductor layer) ES and the unit electrode UE1, or the electron supply layer (nitride semiconductor layer) ES and the unit electrode UE2 come in ohmic contact with each other.

Figure 6:
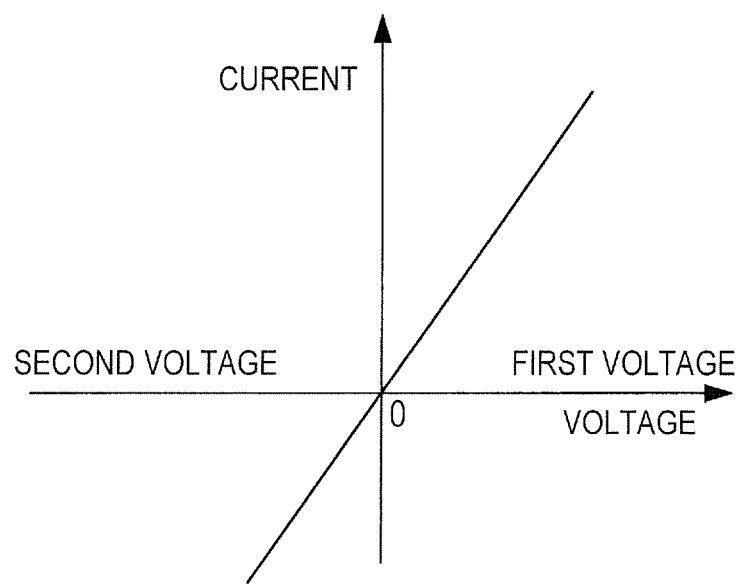
FIG. 6 is a graph illustrating a current to voltage characteristic in an ohmic contact.

FIG. 6 is a graph illustrating a current to voltage characteristic in the ohmic contact. Referring to FIG. 6, the axis of abscissa represents a voltage to be applied between the ohmic contacts, and the axis of ordinate represents a current that flows between the ohmic contacts. As illustrated in FIG. 6, when a first voltage is applied to the ohmic contact, a current in a positive direction linearly rises with an increase in the first voltage. On the other hand, when a second voltage is applied to the ohmic contact, a current in a negative direction linearly rises with an increase in the second voltage. From this face, it is understood that in the current to voltage characteristic of the ohmic contact, the current to voltage characteristic in a first voltage polarity is completely identical with the current to voltage characteristic in a second voltage polarity. That is, the ohmic contact is a resistive contact which is defined as a contact having no rectification characteristic as with a Schottky contact.

(Features of First Embodiment)

Figure 7:
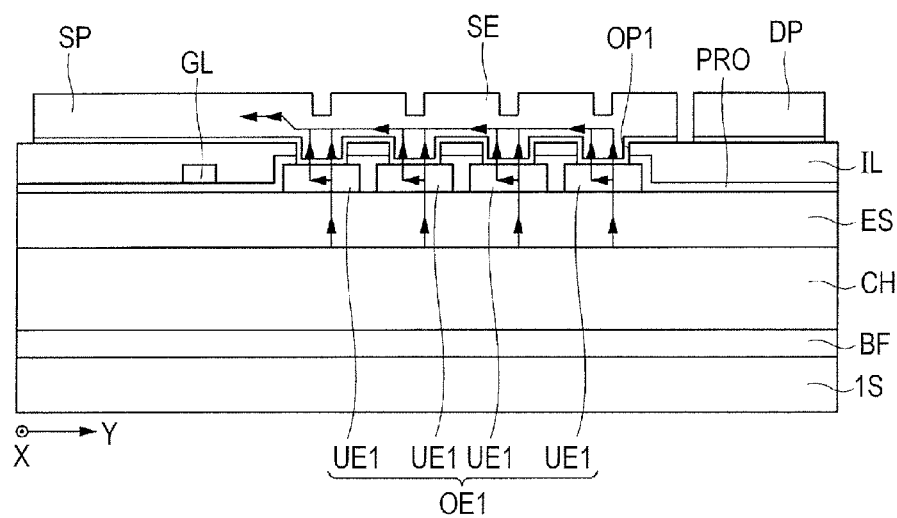
FIG. 7 is a cross-sectional view of a source electrode mainly taken along a B-B line of FIG. 3.

FIG. 7 is a cross-sectional view of the source electrode SE mainly taken along a B-B line of FIG. 3. In the first embodiment, the structure in which the source electrode SE is taken along a section line extending in the Y-axial direction, and the structure in which the drain electrodes DE is taken along a section line extending in the Y-axial direction have the same configuration. Therefore, in the following description, attention is paid to the source electrodes SE. The following structure is applicable to not only the source electrodes SE and a structure immediately below the source electrodes SE, but also the drain electrodes DE and a structure immediately below the drain electrodes DE.

As illustrated in FIG. 7, in the power MOSFET of the first embodiment, the buffer layer BF is formed over the semiconductor substrate 1S made of, for example, silicon, and the channel layer CH made of, for example, GaN is formed over the buffer layer BF. The electron supply layer ES made of, for example, AlGaN is formed over the channel layer CH.

The plurality of unit electrodes UE1 are aligned over the electron supply layer ES in the Y-axial direction. The ohmic electrode OE1 is formed by those unit electrodes UE1. Further, the protective film PRO formed of, for example, a silicon oxide film, and the interlayer insulating film IL are formed to cover the ohmic electrode OE1. Also, the gate line GL is formed over the protective film PRO, and the gate line GL is covered with the interlayer insulating film IL.

The plurality of opening portions OP1 are formed in the protective film PRO and the interlayer insulating film IL to expose the respective surfaces of the plurality of unit electrodes UE1 configuring the ohmic electrode OE1. The source electrodes SE are formed over the interlayer insulating film IL from the interior of the opening portions OP1, and the source pad SP is formed integrally with the source electrodes SE. Also, the drain pad DP is also formed over the interlayer insulating film IL to be separated from the source electrodes SE so as to be electrically isolated from the source electrodes SE. In this case, the unit electrodes UE1 are each formed of an aluminum film, and the source electrodes SE are each formed of a laminated film including, for example, a barrier conductor film formed of a titanium/titanium nitride film, and an AlCu film or an AlSiCu film.

The feature of the first embodiment resides in that the ohmic electrode OE1 is configured by the plurality of divided unit electrodes UE1. With this configuration, the electromigration resistance in the ohmic electrode OE1 can be improved.

For example, in the related art, as illustrated in FIG. 2, the ohmic electrode OE1 is configured by a single body. That is, in the related art, since the ohmic electrode OE1 extends in the Y-axial direction, a part of the on-state current flows into the ohmic electrode OE1 along the Y-axial direction (negative direction). In this case, electrons are accelerated by an electric field within the ohmic electrode OE1, and after the electrons are accelerated to some extent, the electrons collide with metal ions configuring the ohmic electrode OE1. A kinetic energy of the electrons are converted into a lattice vibration energy (thermal energy) of the metal ions, and also converted into the kinetic energy of the metal ions.

On the other hand, the metal ions are thermalized at a substantially fixed position of a periodic potential, and can migrate beyond a wall of the potential with a certain probability. The wall of the potential is generally called "activation energy", and a value is substantially determined according to a material.

Because the metal ions that exceed the wall of the potential naturally return to an original position, or migrate at random, the metal is not changed macroscopically. However, when the kinetic energy of electrons accelerated by an electric field is supplied to the metal ions, the metal ions configuring the ohmic electrode OE1 migrate along a flow of the electrons in the same direction (direction along which the electrons flow) at the same time. As a result, as the number of electrons accelerated by the electric field is increased, voids are generated in the ohmic electrode OE1, and a disconnection occurs in a worse case.

That is, in the related art, as illustrated in FIG. 2, because the ohmic electrode OE1 is configured by a single body extending in the Y-axial direction, a current density of the on-state current that flows into the ohmic electrode OE1 along the Y-axial direction (negative direction) is increased. As a result, the metal ions configuring the ohmic electrode OE1 migrate in one direction along which the electrons flow at the same time, by a flow of the electrons configuring the on-state current. As a result, in the related art, the ohmic electrode OE1 is liable to be disconnected.

On the contrary, as illustrated in FIG. 7, the ohmic electrode OE1 according to the first embodiment is not configured by a single body, but configured by a plurality of unit electrodes UE1 divided to be separated from each other. That is, the ohmic electrode OE1 according to the first embodiment is configured by the plurality of divided unit electrodes UE1 which are separated in the Y-axial direction. As a result, according to the ohmic electrode OE1 of the first embodiment, a part of the on-state current can be prevented from flowing into the ohmic electrode OE1 along the Y-axial direction (negative direction).

That is, in the first embodiment, because the ohmic electrode OE1 is configured by the plurality of divided unit electrodes UE1 which are separated from each other, the on-state current can be prevented from flowing across the plurality of unit electrodes UE1 in the Y-axial direction (negative direction). Further, in each of the plurality of unit electrodes UE1, the current density of the on-state current flowing in the Y-axial direction (negative direction) can be prevented from increasing.

As a result, according to the first embodiment, since the ohmic electrode OE1 is configured by the plurality of divided unit electrodes UE1 which are separated from each other, the electromigration resistance of the ohmic electrode OE1 can be improved. That is, in the first embodiment, because the ohmic electrode OE1 is divided into the plurality of unit electrodes UE1, the current density of the current flowing in the ohmic electrode OE1 in the Y-axial direction (longitudinal direction) can be suppressed as compared in the related art.

Referring to FIG. 7, arrows indicate paths in which the on-state current flows immediately below the source electrodes SE. As indicated by the arrows, the on-state current flows into the ohmic electrode OE1 arranged over the electron supply layer ES after having flowing in the interface between the channel layer CH and the electron supply layer ES. In this case, as illustrated in FIG. 7, because the ohmic electrode OE1 is configured by the plurality of divided unit electrodes UE1 which are separated from each other along the Y-axial direction, the on-state current is diverged into the plurality of unit electrodes UE1, and flows. Since the plurality of ohmic electrodes OE1 are separated from each other in the Y-axial direction, the on-state current can be prevented from flowing into the ohmic electrode OE1 along the Y-axial direction (negative direction). In other words, because the ohmic electrode OE1 is configured by the plurality of divided unit electrodes UE1 which are separated from each other, the on-state current can be effectively prevented from flowing across the plurality of unit electrodes UE1 in the Y-axial direction (negative direction). Further, in each of the plurality of unit electrodes UE1, the current density of the on-state current flowing in the Y-axial direction (negative direction) can be prevented from increasing. As a result, the electromigration can be prevented from being generated in the ohmic electrode OE1.

Thereafter, the on-state current flowing in each of those unit electrodes UE1 flows into the source electrodes SE from the opening portions OP1 formed in the respective unit electrodes UE1, and flows from the source electrodes SE into the source pad SP.

In this example, as illustrated in FIG. 7, the source electrodes SE are electrically connected to the respective unit electrodes UE1, and extend in the Y-axial direction. From this fact, in the source electrodes SE, the on-state currents that have flown in the plurality of unit electrodes UE1 join together, and flow. Accordingly, there is a concern about the degradation of the electromigration resistance in the source electrodes SE. However, in the first embodiment, there is no need to concern about this drawback.

This is because in the first embodiment, the source electrodes SE is not configured by an aluminum (Al) film, but configured by an aluminum alloy film represented by an AlCu film or an AlSiCu film. For example, in the case of the AlCu film, a slight amount of copper (Cu) of several or lower which is heavier than aluminum (Al) is added to the AlCu film. In this case, copper (Cu) has a function of being deposited on a crystal grain boundary of aluminum (Al), and adhering the respective crystal grains of aluminum (Al) to each other. As a result, in the AlCu film, the electromigration resistance can be improved. That is, because the source electrodes SE are each formed of an AlCu film higher in the electromigration resistance than the aluminum film, or the AlSiCu film, the occurrence of voids or the disconnection caused by the electromigration can be sufficiently suppressed in the source electrodes SE.

Further, for example, a thickness of the AlCu film and a thickness of the AlSiCu film, which configure the source electrodes SE, are about 4.5 μm whereas a thickness of the aluminum film configuring the ohmic electrode OE1 (unit electrode UE1) is about 0.3 μm. Accordingly, because the thickness of the AlCu film configuring the source electrodes SE is sufficiently thicker than the thickness of the ohmic electrode OE1 (unit electrodes UE1), the voids and the disconnection caused by the electromigration are difficult to generate.

Thus, in the source electrodes SE, because the AlCu film or the AlSiCu film which is higher in the electromigration resistance than the aluminum film is used, and the thickness of the AlCu film and the thickness of the AlSiCu film are thick, the occurrence of voids and the disconnection caused by the electromigration are not actualized.

Accordingly, a configuration in which the ohmic electrode OE1 is also formed of the aluminum alloy film represented by, for example, the AlCu film or the AlSiCu film is useful with the application of the above-mentioned technique. That is, since the plurality of unit electrodes UE1 are each formed of the aluminum alloy film in addition to the feature that the ohmic electrode OE1 is configured by the plurality of divided unit electrodes UE1 which are separated from each other (feature of the first embodiment), the electromigration resistance can be further improved. As a result, according to the first embodiment, the power MOSFET very high in the reliability can be provided.

(Method of Manufacturing Semiconductor Device According to First Embodiment)

The semiconductor device (power MOSFET) according to the first embodiment is configured as described above, and a method of manufacturing the semiconductor device will be described with reference to the drawings. In the method of manufacturing the semiconductor device described below will be first described with reference to a cross-sectional view taken along a line A-A in FIG. 3, and thereafter described with reference to a cross-sectional view taken along a line B-B of FIG. 3 showing the feature of the first embodiment.

Figure 8:
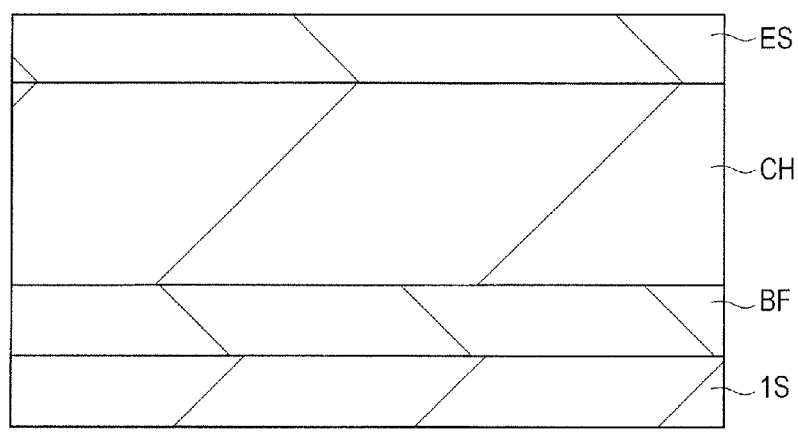
FIG. 8 is a cross-sectional view illustrating a process of manufacturing a semiconductor device according to the first embodiment.

As illustrated in FIG. 8, for example, a semiconductor layer structure is formed over the semiconductor substrate 1S made of silicon having a (111) surface exposed, through a metal organic chemical vapor deposition (MOCVD). In the semiconductor layer structure, the buffer layer BF made of, for example, undoped gallium nitride (GaN) is formed. Subsequently, the channel layer CH made of undoped gallium nitride (GaN) is formed over the buffer layer BF. Thereafter, the electron supply layer ES made of undoped (AlGaN) is formed over the channel layer CH. In this manner, the semiconductor layer structure is formed. The semiconductor layer structure is formed by the growth of a group-III surface laminated in a [0001] crystal axis (C-axis) direction.

Figure 9:
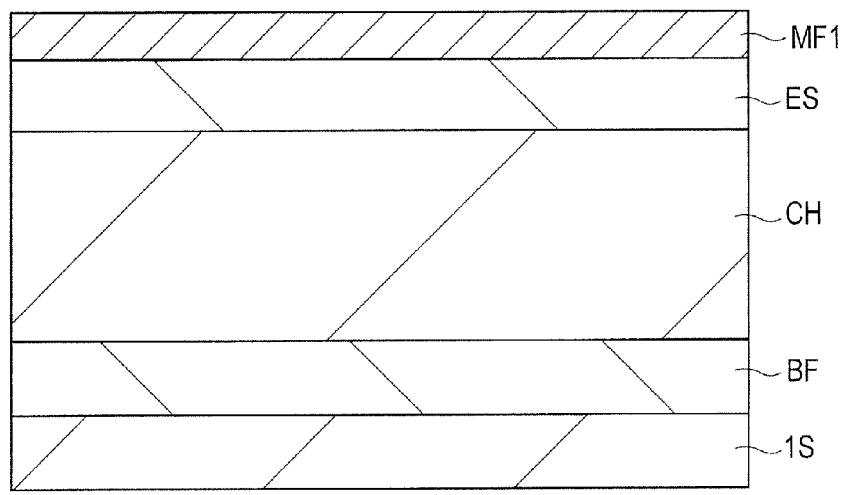
FIG. 9 is a cross-sectional view illustrating a process of manufacturing the semiconductor device subsequent to FIG. 8.
Figure 10:
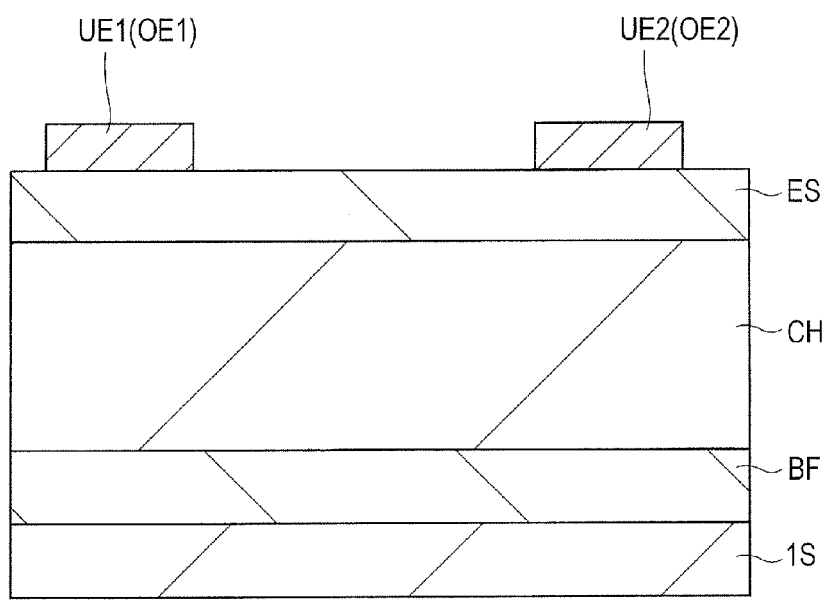
FIG. 10 is a cross-sectional view illustrating a process of manufacturing the semiconductor device subsequent to FIG. 9.

Subsequently, as illustrated in FIG. 9, a metal film MF1 formed of, for example, an aluminum film is formed over the electron supply layer ES. The metal film MF1 can be formed through, for example, a sputtering technique. Thereafter, as illustrated in FIG. 10, the metal film MF1 is patterned through a photolithography and an etching technique. As a result, the unit electrodes UE1 (ohmic electrode OE1) and the unit electrodes UE2 (ohmic electrode OE2) which are each formed of the metal film MF1 can be formed over the electron supply layer ES. The unit electrodes UE1 and the unit electrodes UE2 are formed to be separated from each other.

Figure 11:
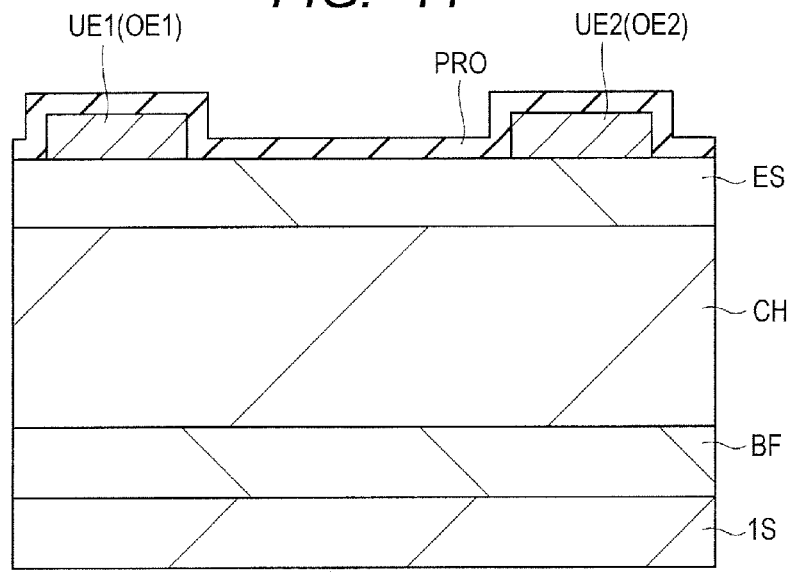
FIG. 11 is a cross-sectional view illustrating a process of manufacturing the semiconductor device subsequent to FIG. 10.

Subsequently, as illustrated in FIG. 11, the protective film PRO is formed over the electron supply layer ES on which the unit electrodes UE1 and the unit electrodes UE2 are formed. The protective film PRO is formed to cover the unit electrodes UE1 and the unit electrodes UE2, and formed of, for example, a silicon oxide film.

Figure 12:
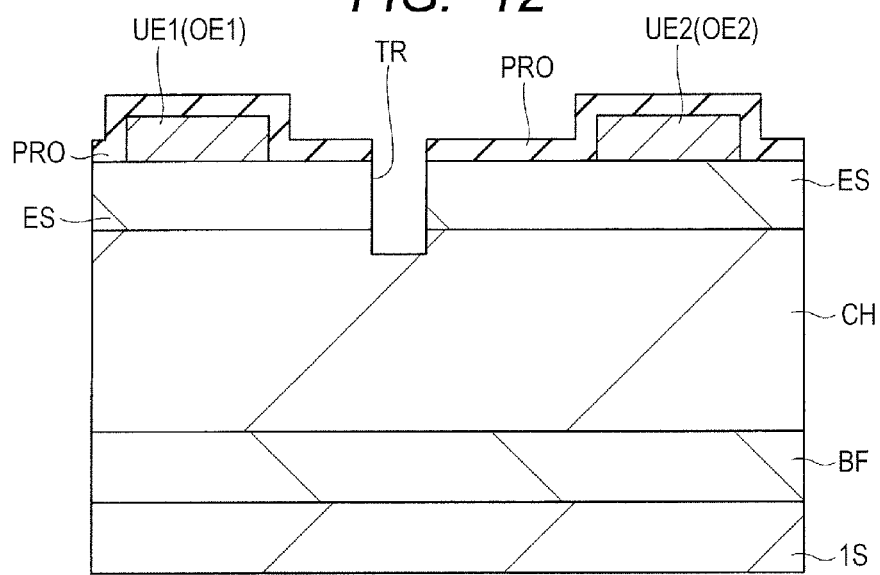
FIG. 12 is a cross-sectional view illustrating a process of manufacturing the semiconductor device subsequent to FIG. 11.

Thereafter, as illustrated in FIG. 12, the trench (groove) TR that penetrates through the protective film PRO and the electron supply layer ES and reaches the channel layer CH is formed through the photolithography and the etching technique. The trench TR is formed between the unit electrodes UE1 and the unit electrodes UE2.

Figure 13:
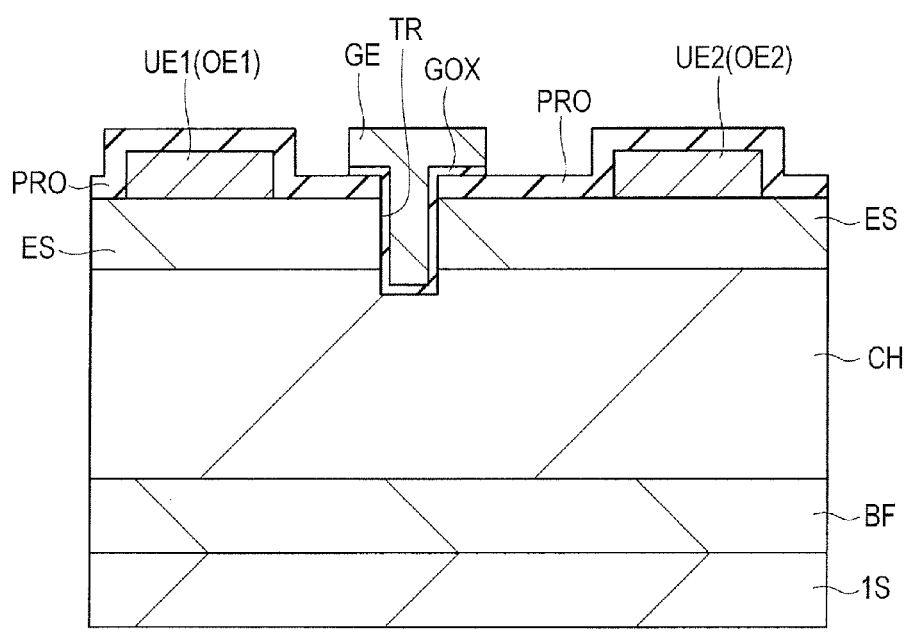
FIG. 13 is a cross-sectional view illustrating a process of manufacturing the semiconductor device subsequent to FIG. 12.

Subsequently, as illustrated in FIG. 13, the gate insulating film GOX is formed over a part of the protective film PRO from an inner wall of the trench TR, and the gate electrodes GE formed of, for example, a polysilicon film or a metal film is formed over the gate insulating film GOX so as to fill the interior of the trench TR. In this situation, the gate insulating film GOX can be formed of, for example, the silicon oxide film, but is not limited to this configuration, and may be formed of a high dielectric constant film higher in dielectric constant than the silicon oxide film.

For example, the high dielectric constant film is formed of an aluminum oxide film ($Al_2O_3$ film), or a hafnium oxide film ($HfO_2$ film) which is one of hafnium oxides. However, the hafnium oxide film may be replaced with the other hafnium insulating films such as a hafnium aluminate film, an HfON film (hafnium oxynitride film), an HfSiO film (hafnium silicate film), an HfSiON film (hafnium silicon oxynitride film), and an HfAlO film. Further, the high dielectric constant film can be formed of a hafnium insulating film in which oxide such as tantalum oxide, niobium oxide, titanium oxide, zirconium oxide, lanthanum oxide, or yttrium oxide is introduced into those hafnium insulating films. Since the hafnium insulating film is high in the dielectric constant than the silicon oxide film or a silicon oxynitride film as with the hafnium oxide film, a leak current can be reduced as with a case using the hafnium oxide film.

Figure 14:
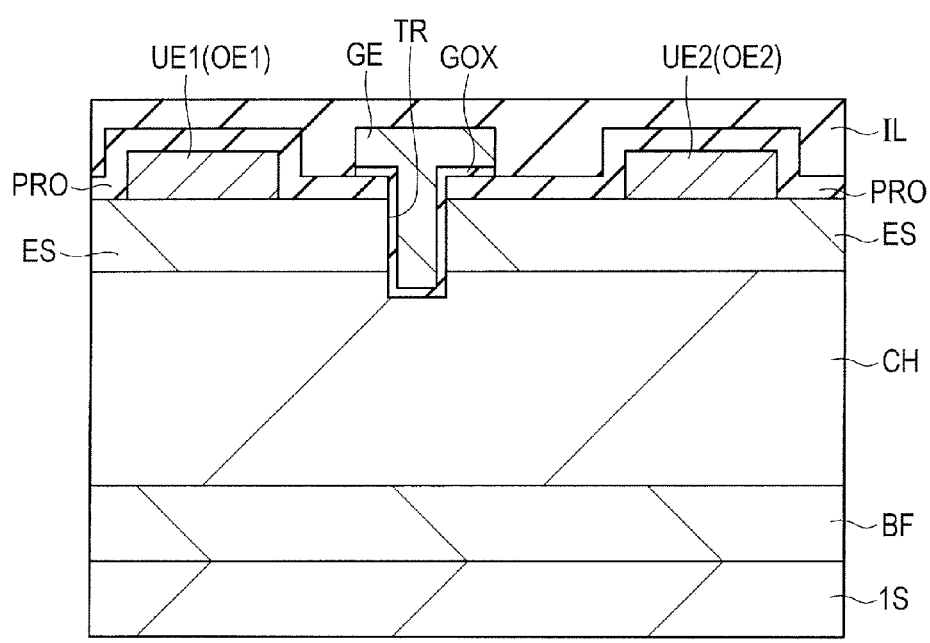
FIG. 14 is a cross-sectional view illustrating a process of manufacturing the semiconductor device subsequent to FIG. 13.
Figure 15:
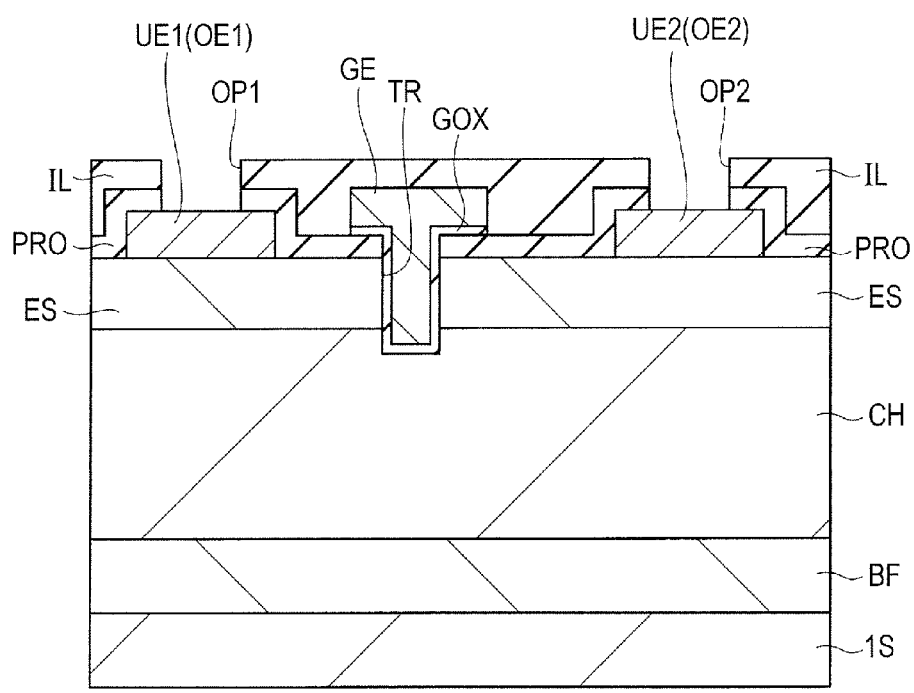
FIG. 15 is a cross-sectional view illustrating a process of manufacturing the semiconductor device subsequent to FIG. 14.

Subsequently, as illustrated in FIG. 14, the interlayer insulating film IL is formed over the gate electrodes GE and the protective film PRO. The interlayer insulating film IL can be formed of, for example, the silicon oxide film. Thereafter, as illustrated in FIG. 15, the opening portions OP1 and the opening portions OP2 that penetrate through the interlayer insulating film IL and the protective film PRO are formed through the photolithography and the etching technique. The opening portions OP1 are formed to expose the surface of the unit electrodes UE1, and the opening portions OP2 are formed to expose the surface of the unit electrodes UE2.

Figure 16:
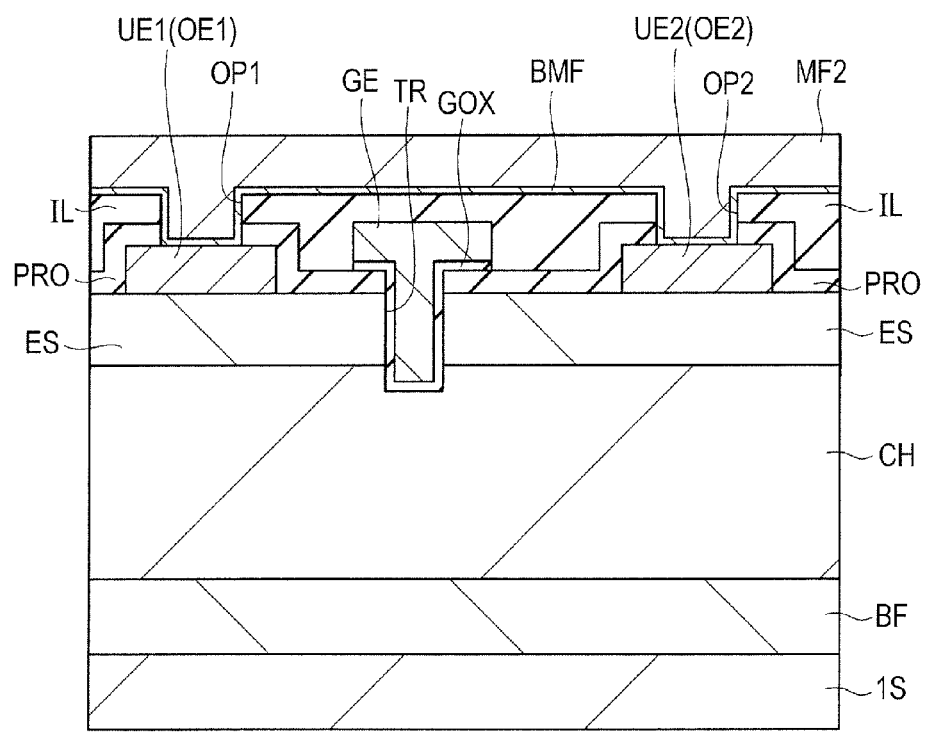
FIG. 16 is a cross-sectional view illustrating a process of manufacturing the semiconductor device subsequent to FIG. 15.

Subsequently, as illustrated in FIG. 16, a barrier conductor film (barrier metal film) BMF formed of, for example, a titanium/titanium nitride film is formed over the interlayer insulating film IL having the opening portions OP1 and the opening portions OP2 formed therein, and a metal film MF2 formed of, for example, an aluminum alloy film represented by an AlCu film or an AlSiCu film is formed over the barrier conductor film BMF. The barrier conductor film BMF and the metal film MF2 can be formed through the sputtering technique.

Figure 17:
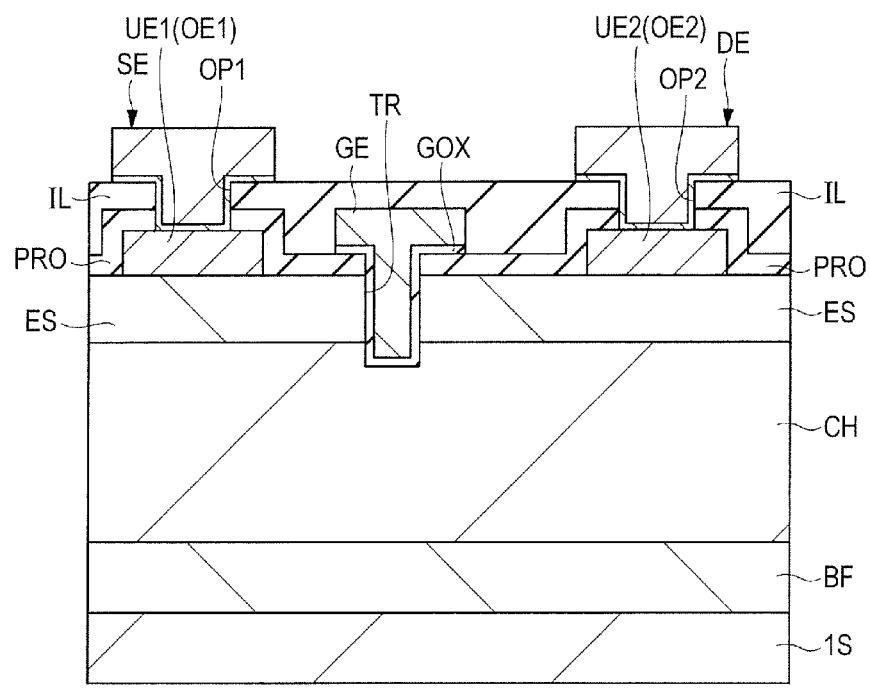
FIG. 17 is a cross-sectional view illustrating a process of manufacturing the semiconductor device subsequent to FIG. 16.

Thereafter, as illustrated in FIG. 17, the metal film MF2 and the barrier conductor film BMF are patterned through the photolithography and the etching technique. As a result, the source electrodes SE can be embedded in the interior of the opening portions OP1, and formed over a part of the interlayer insulating film IL. Likewise, the drain electrodes DE can be embedded in the interior of the opening portions OP2, and formed over a part of the interlayer insulating film IL. As a result, the source electrodes SE can be formed to be electrically connected to the unit electrodes UE1, and the drain electrodes DE can be formed to be electrically connected to the unit electrodes UE2. With the above process, the semiconductor device (power MOSFET) according to the first embodiment can be formed.

Subsequently, the method of manufacturing the semiconductor device will be described from the viewpoints of clarifying the feature in the first embodiment. More specifically, the method of manufacturing the semiconductor device according to the first embodiment will be described below with reference to a cross-sectional view taken along a line B-B in FIG. 3.

Figure 18:
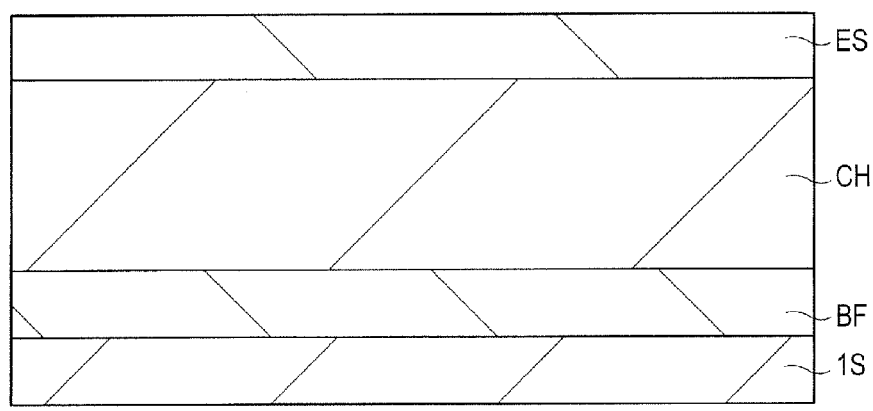
FIG. 18 is a cross-sectional view illustrating a process manufacturing the semiconductor device according to the first embodiment.
Figure 19:
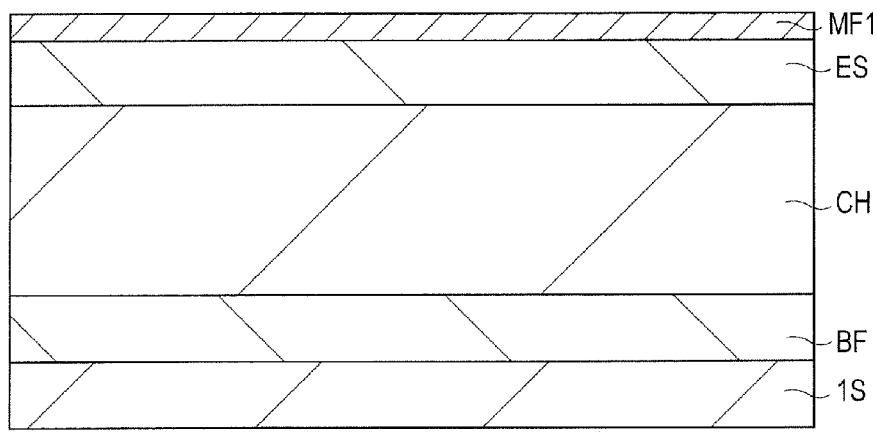
FIG. 19 is a cross-sectional view illustrating a process of manufacturing the semiconductor device subsequent to FIG. 18.

First, through the process described with reference to FIG. 8, the semiconductor layer structure illustrated in FIG. 18 is formed. Then, as illustrated in FIG. 19, the metal film MF1 formed of, for example, the aluminum film is formed over the electron supply layer ES formed over an uppermost layer of the semiconductor layer structure.

Figure 20:
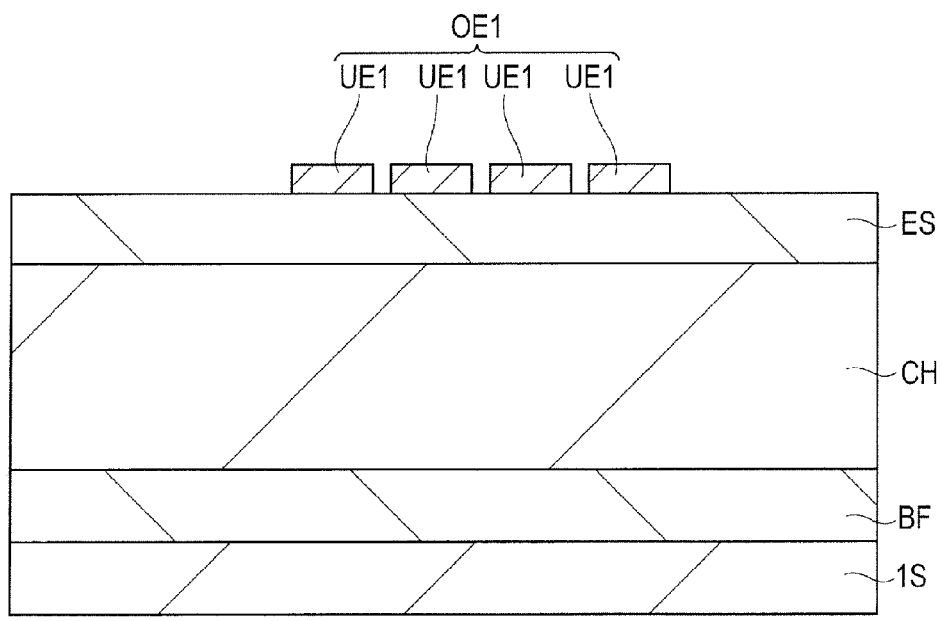
FIG. 20 is a cross-sectional view illustrating a process of manufacturing the semiconductor device subsequent to FIG. 19.

Thereafter, as illustrated in FIG. 20, the metal film MF1 is patterned through the photolithography and the etching technique to form a plurality of unit electrodes UE1. Those unit electrodes UE1 are separated from each other, and the ohmic electrode OE1 is formed by those plural unit electrodes UE1. In this way, in the first embodiment, the ohmic electrode OE1 can be configured by the plurality of unit electrodes UE1.

Figure 21:
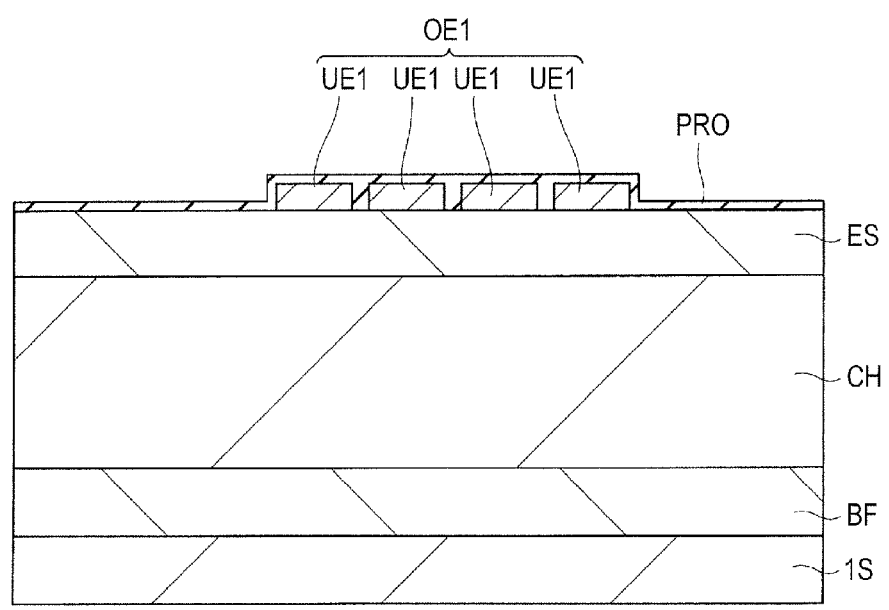
FIG. 21 is a cross-sectional view illustrating a process of manufacturing the semiconductor device subsequent to FIG. 20.

Subsequently, as illustrated in FIG. 21, the protective film PRO is formed over the electron supply layer ES on which the plurality of unit electrodes UE1 are formed. The protective film PRO can be formed of, for example, the silicon oxide film, and formed through a CVD (chemical vapor deposition) technique.

Figure 22:
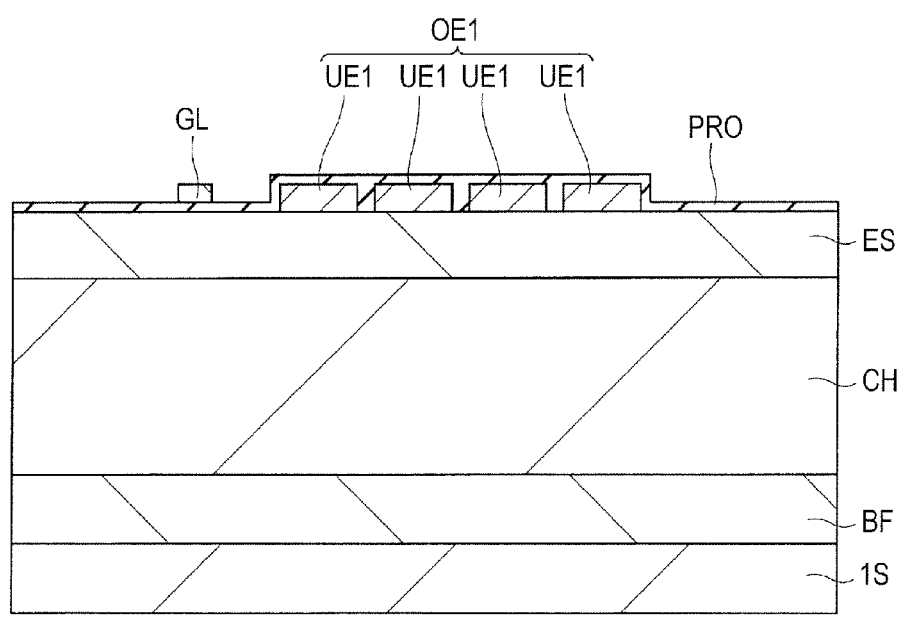
FIG. 22 is a cross-sectional view illustrating a process of manufacturing the semiconductor device subsequent to FIG. 21.
Figure 23:
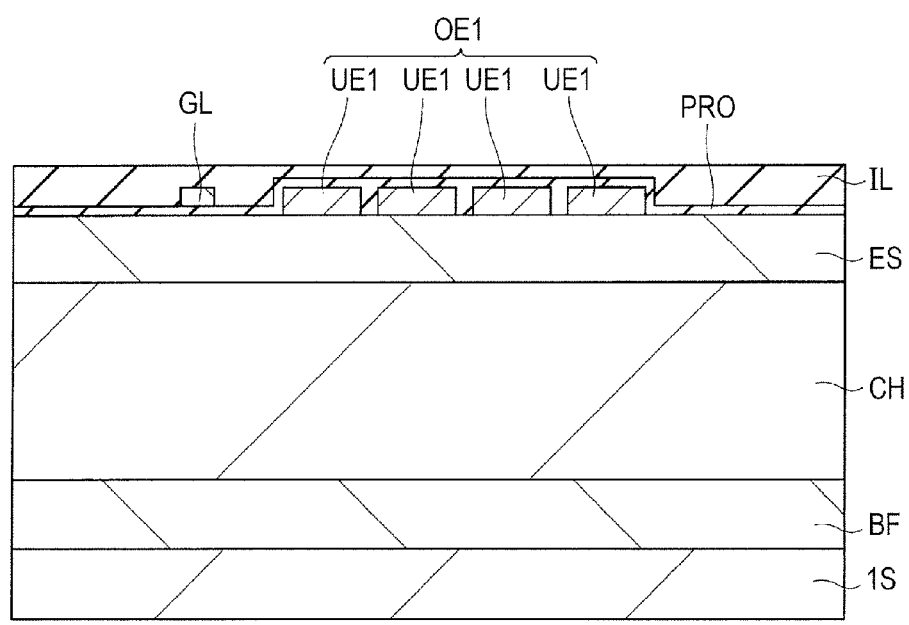
FIG. 23 is a cross-sectional view illustrating a process of manufacturing the semiconductor device subsequent to FIG. 22.

Subsequently, after the gate line GL has been formed over the protective film PRO as illustrated in FIG. 22, the interlayer insulating film IL is formed over the protective film PRO on which the gate line GL is formed as illustrated in FIG. 23. The interlayer insulating film IL can be formed of, for example, the silicon oxide film, and formed through, for example, the CVD technique.

Figure 24:
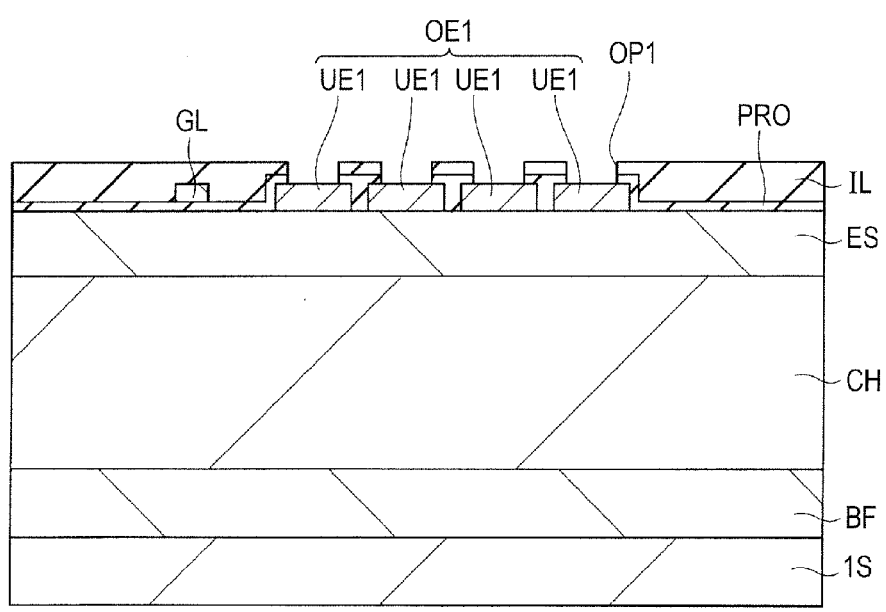
FIG. 24 is a cross-sectional view illustrating a process of manufacturing the semiconductor device subsequent to FIG. 23.

Thereafter, as illustrated in FIG. 24, the plurality of opening portions OP1 that penetrate through the interlayer insulating film IL and the protective film PRO are formed through the photolithography and the etching technique. The plurality of opening portions OP1 are formed so as to expose the respective surfaces of the plurality of unit electrodes UE1.

Figure 25:
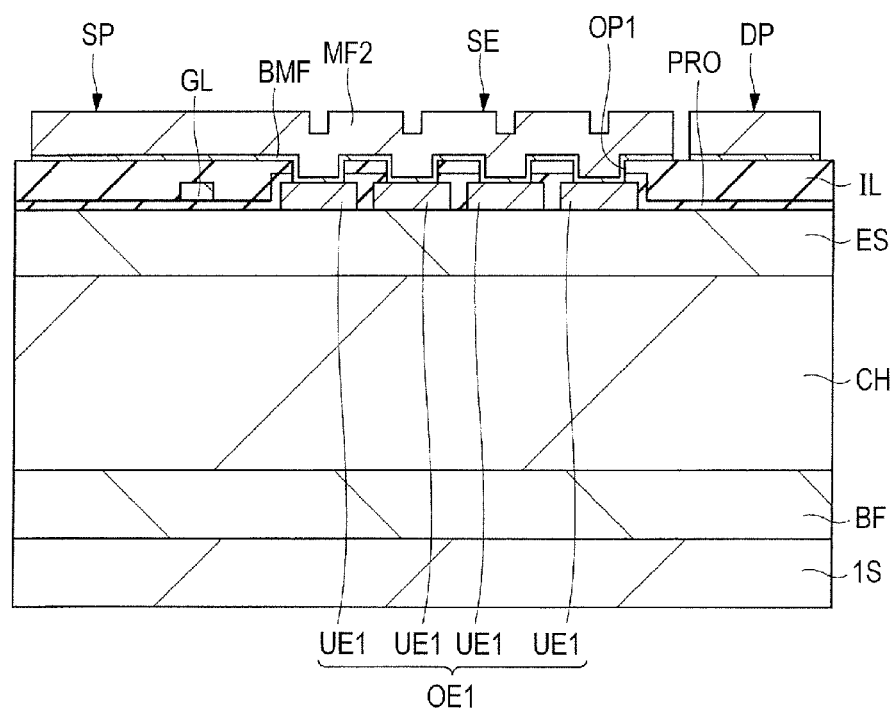
FIG. 25 is a cross-sectional view illustrating a process of manufacturing the semiconductor device subsequent to FIG. 24.

Then, as illustrated in FIG. 25, the barrier conductor film BMF formed of, for example, the titanium/titanium nitride film is formed over the interlayer insulating film IL in which the opening portions OP1 are formed, and the metal film MF2 formed of, or example, the aluminum alloy film represented by the AlCu film or the AlSiCu film is formed over the barrier conductor film BMF. The barrier conductor film BMF and the metal film MF2 can be formed through, for example, the sputtering technique.

Thereafter, the metal film MF2 and the barrier conductor film BMF are patterned through the photolithography and the etching technique. As a result, the source electrodes SE can be embedded in the interior of the opening portions OP1, and formed over a part of the interlayer insulating film IL. Further, the source pad SP integrated with the source electrodes SE, and the drain pad DP separated to be electrically isolated from the source electrodes SE are formed in the same process. With the above process, the semiconductor device (power MOSFET) in the first embodiment can be manufactured.

(Typical Advantages of First Embodiment)

The semiconductor device according to the first embodiment can obtain typical advantages described below.

(1) According to the first embodiment, in a process of manufacturing the power MOSFET made of the nitride semiconductor material, the silicon semiconductor process can be applied. This means that the use of the metal film used in the compound semiconductor process can be reduced, as a result of which the manufacturing costs of the power MOSFET in the first embodiment can be reduced.

(2) In this case, the ohmic electrode OE1 (OE2) formed between the power MOSFET made of the nitride semiconductor material, and the interconnect layers (source electrodes SE and drain electrodes DE) is formed of the aluminum film instead of a film including the metal film.

As a result, in the power MOSFET dealing with a large current, there is a concern about the occurrence of voids and the disconnection caused by the electromigration in the ohmic electrode OE1 (OE2).

Regarding this matter, in the first embodiment, the ohmic electrode OE1 is configured by the plurality of divided unit electrodes UE1 which are separated from each other, and the ohmic electrode OE2 is configured by the plurality of divided unit electrodes UE2 which are separated from each other. For that reason, the on-state current can be effectively prevented from flowing across the plurality of unit electrodes UE1 or the plurality of unit electrodes UE2 in the Y-axial direction (negative direction). Further, in each of the plurality of unit electrodes UE1 and each of the plurality of unit electrodes UE2, the current density of the on-state current flowing in the Y-axial direction (negative direction) can be prevented from increasing.

As a result, the electromigration can be prevented from being generated in the ohmic electrode OE1 and the ohmic electrode OE2.

Therefore, according to the power MOSFET of the first embodiment, the occurrence of voids and the disconnection caused by the electromigration can be effectively suppressed, as a result of which the reliability of the semiconductor device can be improved.

(3) For example, it is assumed that a drain current density (on-state current density) in the power MOSFET according to the first embodiment is 0.2 A/mm (the drain current density per 1 mm is 0.2 A in a gate width direction of the gate electrode (direction perpendicular to a channel). Further, it is assumed that a length of the unit electrodes UE1 (UE2) configuring the ohmic electrode OE1 (OE2) in the longitudinal direction is 2 mm, a length thereof in a direction orthogonal to the longitudinal direction 4 μm, and a gap interval between the divided unit electrodes UE1 (UE2) is 1 μm. The calculation results under those conditions are illustrated in FIG. 26.

Figure 26:
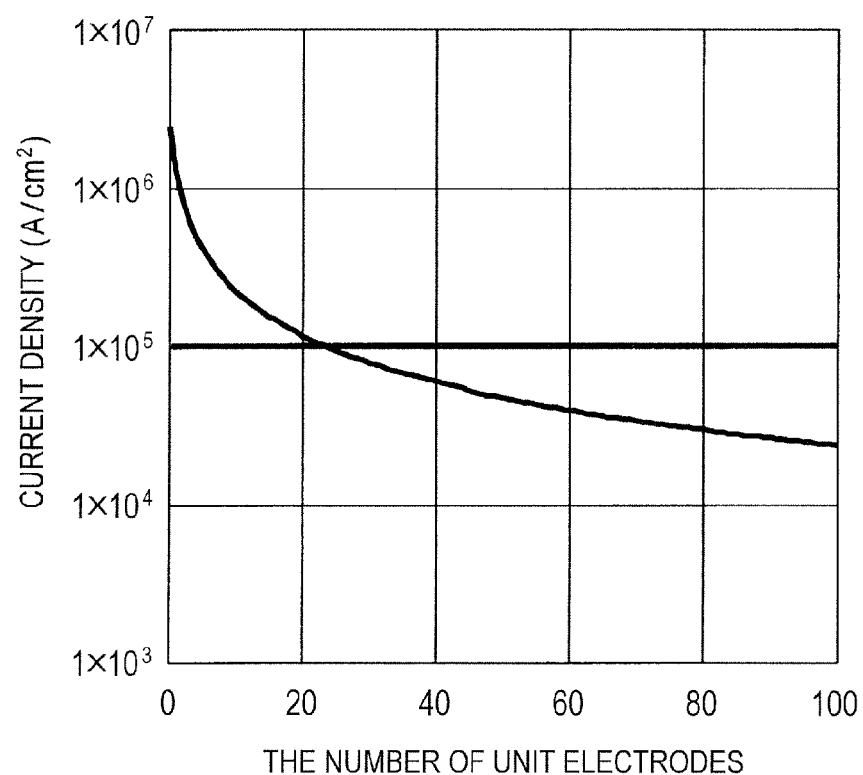
FIG. 26 is a graph illustrating a relationship between a current density (A/cm$^2$) and the number of unit electrodes.

FIG. 26 illustrates a relationship between the current density (A/cm2) (the current density indicates a value in a unit cross-section perpendicular to the direction along which the current flows), and the number of divisions (the number of unit electrodes) of unit electrodes UE1 (UE2).

As illustrated in FIG. 26, it is found that the current density becomes smaller as the number of divisions of the unit electrodes UE1 (UE2) is increased more. For example, in the ohmic electrode OE1 (OE2), when it is assumed that an allowable current density in which the occurrence of voids and the disconnection caused by the electromigration are generated is $1 \times 10^5$ (A/cm$^2$), the current density becomes $2.5 \times 10^6$ (A/cm$^2$) which is higher than the allowable current density by a single digit or more in the number of divisions 0 (corresponding to the related art). On the contrary, for example, if the number of unit electrodes is set to 24 or more, the current density can be reduced more than the allowable current density. As a result, the ohmic electrode OE1 (OE2) is configured by the plurality of divided unit electrodes UE1 (UE2) which are separated from each other, with the result the ohmic electrode OE1 (OE2) higher in the electromigration resistance can be realized.

(4) Further, in the first embodiment, the source electrodes SE electrically connected to the ohmic electrode OE1, or the drain electrodes DE electrically connected to the ohmic electrode OE2 are formed of the aluminum alloy film represented by the AlCu film or the AlSiCu film which is higher in the electromigration resistance than the aluminum film. From this fact, in the first embodiment, the electromigration resistance can be improved in the source electrodes SE and the drain electrodes DE. In particular, in the first embodiment, the source electrodes SE and the drain electrodes DE are each formed of a laminated film of a high melting point metal film and an aluminum alloy film represented by a titanium film. Therefore, even if breakage caused by the electromigration is generated in the aluminum alloy film, because an electric connection caused by the high melting point metal film is ensured, the disconnection of the source electrodes SE and the drain electrodes DE can be suppressed.

(5) As described above, the first embodiment has a first feature that the ohmic electrode OE1 is configured by the plurality of divided unit electrodes UE1 which are separated from each other, and the ohmic electrode OE2 is configured by the plurality of divided unit electrodes UE2 which are separated from each other. Also, the first embodiment has a second feature that the source electrodes SE and the drain electrodes DE are each formed of the aluminum alloy film represented by the AlCu film or the AlSiCu film. From this fact, in the first embodiment, in the power MOSFET having the ohmic electrode OE1 (OE2) and the source electrodes SE (drain electrodes DE), separately, the electromigration resistance can be improved with the provision of the above-mentioned first feature and second feature. As a result, according to the first embodiment, the reliability of the power MOSFET having the ohmic electrode OE1 (OE2) and the source electrodes SE (drain electrodes DE), separately, can be improved.

(First Modification)

In the first embodiment, an example in which the unit electrodes UE1 (UE2) divided from each other are each formed of a single layer film made of the aluminum film is described. In a first modification, an example in which the unit electrodes UE1 (UE2) divided from each other are each formed of a laminated film having the titanium film and the aluminum film will be described.

Figure 27:
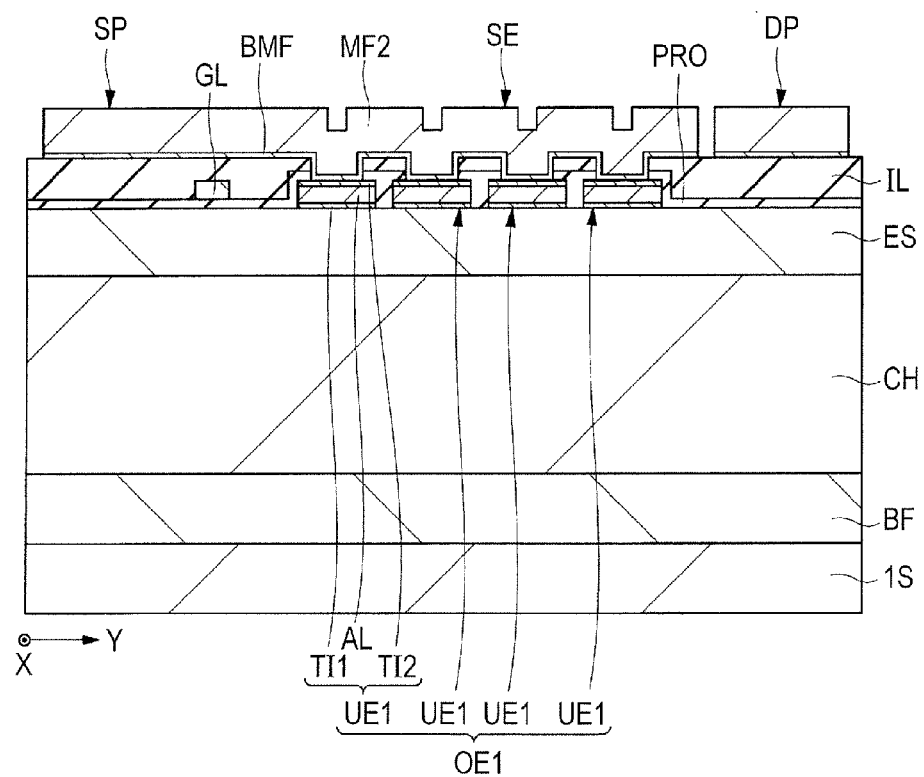
FIG. 27 is a diagram illustrating a cross-section of a power MOSFET according to a first modification.

FIG. 27 is a diagram illustrating a cross-section of a power MOSFET according to the first modification. The configuration of FIG. 27 is substantially identical with that of FIG. 7 illustrating the first embodiment, and therefore a different feature will be described.

The feature of the first modification resides in that as illustrated in FIG. 27, each of the plurality of unit electrodes UE1 configuring the ohmic electrode OE1 is formed of a laminated film including a titanium film TI1, an aluminum film AL, and a titanium film TI2. With this configuration, according to the first modification, the reliability of the semiconductor device can be further improved as compared with the first embodiment.

For example, in the first modification, as with the first embodiment, since the ohmic electrode OE1 is configured by the plurality of divided unit electrodes UE1 which are separated from each other, the electromigration resistance can be improved. If the number of unit electrodes UE1 is small, as illustrated in FIG. 26, it is assumed that the current density of the on-state current (drain current) becomes higher than the allowable current density. In this case, there is a possibility that the breakage caused by the electromigration is generated in the unit electrodes UE1.

However, in the first modification, even if the breakage caused by the electromigration is generated in the aluminum film AL configuring the unit electrodes UE1, the electric connection is ensured by the titanium film TI1 and the titanium film TI2 formed to sandwich the aluminum film AL therebetween. As a result, the disconnection of the unit electrodes UE1 can be prevented. Therefore, according to the first modification, the reliability of the semiconductor device (power MOSFET) can be further improved by synergistic effects of the feature that the ohmic electrode OE1 is configured by the plurality of divided unit electrodes UE1 with the feature that each of the plurality of unit electrodes UE1 is formed of the laminated film including the titanium film TI1, the aluminum film AL, and the titanium film TI2.

In particular, there is a case in which voids are generated in the aluminum film AL by the electromigration even if the aluminum film AL is broken. In this case, although the unit electrodes UE1 are not disconnected, the above-mentioned voids may be generated immediately below the opening portions OP1. In this case, if the titanium film TI2 is not formed over the upper surface of the aluminum film AL, there is a risk that the electric connection between the source electrodes SE and the unit electrodes UE1 is cut by the voids formed immediately below the opening portions OP1. Regarding this matter, in the first modification, because the titanium film TI2 is formed over the upper layer of the aluminum film AL, even if the voids are generated in the aluminum film AL immediately below the opening portions OP1, the electric connection between the source electrodes SE and the unit electrodes UE1 is ensured by the titanium film TI2 formed over the upper layer of the aluminum film AL. As a result, according to the first modification, the reliability of the semiconductor device (power MOSFET) can be further improved.

(Second Modification)

In the first embodiment, for example, as illustrated in FIG. 3, a case in which the width of the source electrodes SE in the X-axial direction is equal to the width of the drain electrodes DE in the X-axial direction is described. In a second modification, an example in which the width of the source electrodes SE in the X-axial direction is equal to the width of the drain electrodes DE in the X-axial direction will be described.

Figure 28:
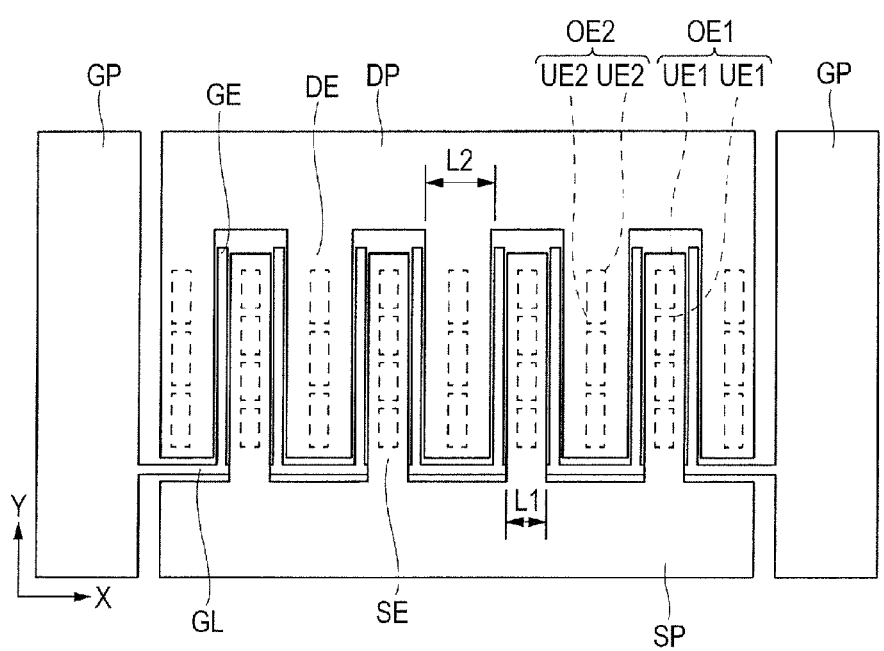
FIG. 28 is a diagram illustrating a plan configuration of a power MOSFET according to a second modification.

FIG. 28 is a diagram illustrating a plan configuration of the power MOSFET according to the second modification. The configuration of FIG. 28 is substantially identical with that of FIG. 3 illustrating the first embodiment, and therefore a different feature will be described.

A feature of the second modification resides in that the number of unit electrodes UE1 disposed over the lower layer of the source electrodes SE is different from the number of unit electrodes UE2 disposed over the lower layer of the drain electrodes DE. More specifically, in the second modification, the number (four in FIG. 28) of unit electrodes UE1 disposed over the lower layer of the source electrodes SE is larger than the number (three in FIG. 28) of unit electrodes UE2 disposed over the lower layer of the drain electrodes DE. This is because of the following reasons.

For example, in the second modification, as illustrated in FIG. 28, a width L1 of the source electrodes SE in the X-axial direction is smaller than a width L2 of the drain electrodes DE in the X-axial direction. In this case, in the power MOSFET according to the second modification, the current density of the on-state current that flows in the drain electrodes DE is lower than the current density of the on-state current that flows in the source electrodes SE. In other words, the current density of the on-state current that flows in the source electrodes SE is larger than the current density of the on-state current that flows in the drain electrodes DE. This means that in a layout configuration of the second modification illustrated in FIG. 28, the ohmic electrode OE1 formed over the lower layer of the source electrodes SE is lower in the electromigration resistance than the ohmic electrode OE2 formed over the lower layer of the drain electrodes DE. From this fact, in the second modification, the number of the plurality of unit electrodes UE1 configuring the ohmic electrode OE1 lower in the electromigration resistance is made larger than the number of the plurality of unit electrodes UE2 configuring the ohmic electrode OE2, to thereby lessen the current density in each of those unit electrodes UE1.

That is, as illustrated in FIG. 28, when the width L1 of the source electrodes SE in the X-axial direction is smaller than the width L2 of the drain electrodes DE in the X-axial direction, the current density in the ohmic electrode OE1 disposed over the lower layer of the source electrodes SE become largest. For that reason, the number of the plurality of unit electrodes UE1 configuring the ohmic electrode OE1 is increased with the results that the current density in the unit electrodes UE1 is reduced to improve the electromigration resistance.

In the second modification, the case in which the width L1 of the source electrodes SE in the X-axial direction is smaller than the width L2 of the drain electrodes DE in the X-axial direction is described. Conversely, it is conceivable that the width L1 of the source electrodes SE in the X-axial direction is larger than the width L2 of the drain electrodes DE in the X-axial direction. In this case, the current density in the ohmic electrode OE2 disposed over the lower layer of the drain electrodes DE becomes largest. For that reason, the number of the plurality of unit electrodes UE2 configuring the ohmic electrode OE2 is increased more than the number of the plurality of unit electrodes UE1 configuring the ohmic electrode OE1, as a result of which the current density in the unit electrodes UE2 can be reduced to improve the electromigration resistance.

(Third Modification)

In the first embodiment, for example, as illustrated in FIG. 3, the example in which the layout arrangement of the plurality of unit electrodes UE1 formed over the lower layer of the source electrodes SE is identical with the layout arrangement of the plurality of unit electrodes UE2 formed over the lower layer of the drain electrodes DE is described. In a third modification, an example in which the layout arrangement of the plurality of unit electrodes UE1 formed over the lower layer of the source electrodes SE is shifted from the layout arrangement of the plurality of unit electrodes UE2 formed over the lower layer of the drain electrodes DE will be described.

Figure 29:
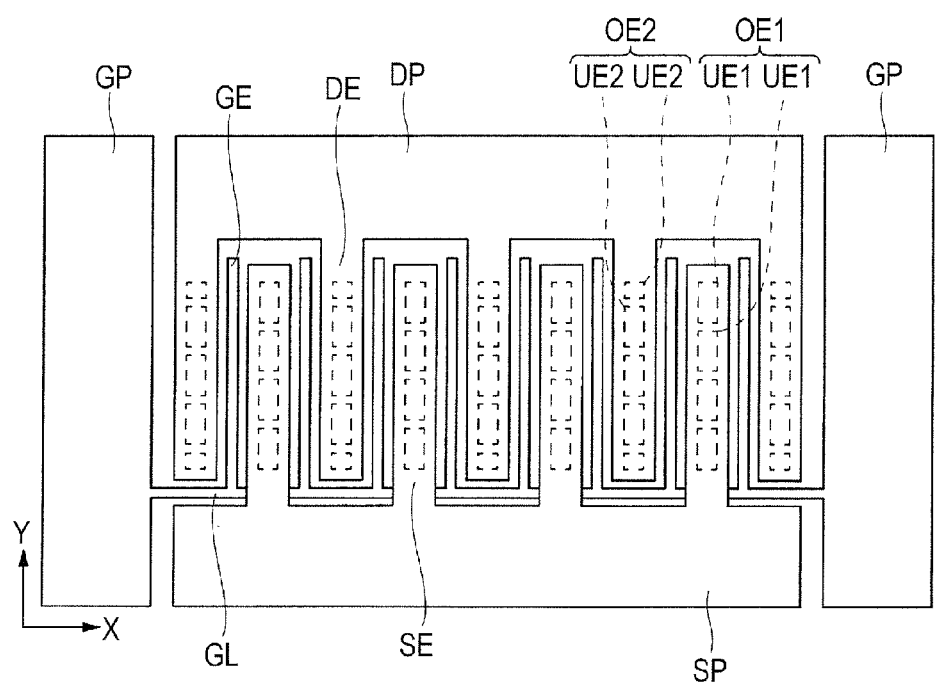
FIG. 29 is a diagram illustrating a plan configuration of a power MOSFET according to a third modification.

FIG. 29 is a diagram illustrating a plan configuration of the power MOSFET according to the third modification. The configuration of FIG. 29 is substantially identical with that of FIG. 3 illustrating the first embodiment, and therefore a different feature will be described.

A feature of the third modification resides in that, as illustrated in FIG. 29, a planar layout configuration of the plurality of unit electrodes UE1 formed over the lower layer of the source electrodes SE is different from a planar layout configuration of the plurality of unit electrodes UE2 formed over the lower layer of the drain electrodes DE.

Also, in this case, the same advantages as those in the first embodiment can be obtained. That is, in the third modification, as in the first embodiment, the ohmic electrode OE1 is configured by the plurality of divided unit electrodes UE1 which are separated from each other, and the ohmic electrode OE2 is configured by the plurality of divided unit electrodes UE2 which are separated from each other. For that reason, in the third modification, as in the first embodiment, the on-state current can be effectively prevented from flowing across the plurality of unit electrodes UE1 or the plurality of unit electrodes UE2 in the Y-axial direction (negative direction). Further, in each of the plurality of unit electrodes UE1 and each of the plurality of unit electrodes UE2, the current density of the on-state current flowing in the Y-axial direction (negative direction) can be prevented from increasing. As a result, the electromigration can be prevented from being generated in the ohmic electrode OE1 and the ohmic electrode OE2. Therefore, according to the power MOSFET of the third modification, the occurrence of voids and the disconnection caused by the electromigration can be effectively suppressed, as a result of which the reliability of the semiconductor device can be improved.

Second Embodiment

In the first embodiment, the example in which the material filled in the opening portions OP1 is the same as the material of the source electrodes SE formed over the interlayer insulating film IL is described. In a second embodiment, an example in which the material filled in the opening portions is different from the material of the source electrodes formed over the interlayer insulating film will be described. Likewise, in the second embodiment, an example in which the material filled in the opening portions is different from the material of the drain electrodes formed over the interlayer insulating film will be described.

(Configuration of Semiconductor Device According to Second Embodiment)

Figure 30:
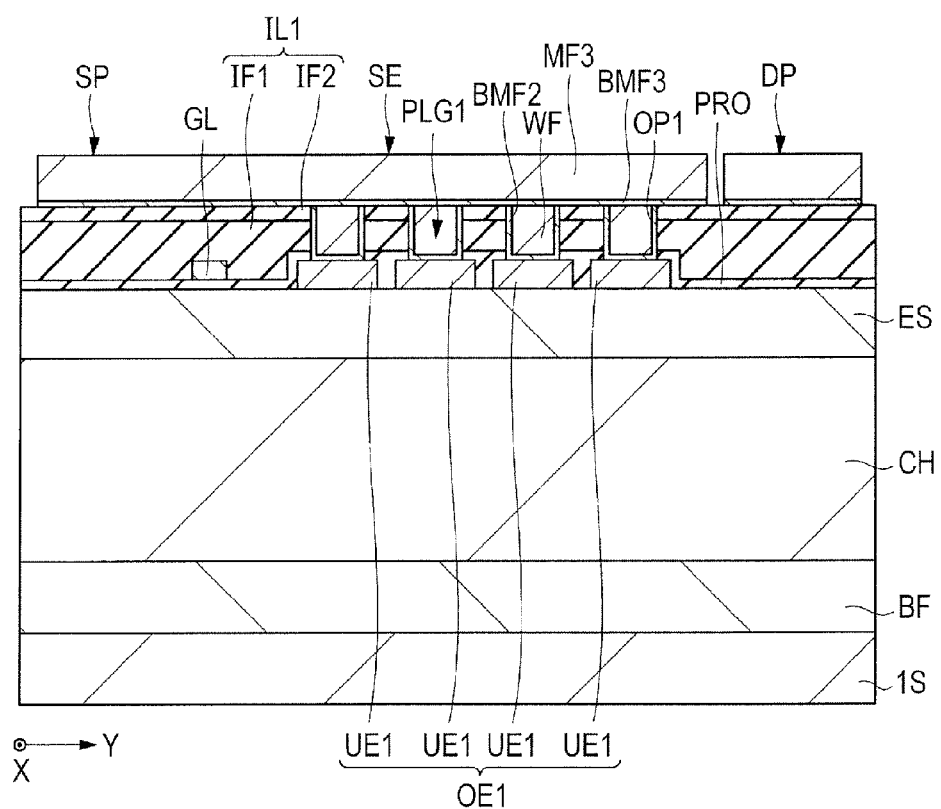
FIG. 30 is a diagram illustrating a cross-section of a power MOSFET according to a second embodiment.

FIG. 30 is a diagram illustrating a cross-section of a power MOSFET according to the second embodiment. The configuration of FIG. 30 is substantially identical with that of FIG. 7 illustrating the first embodiment, and therefore a different feature will be mainly described.

As illustrated in FIG. 30, the protective film PRO is formed to cover the plurality of unit electrodes UE1, and an insulating film IF1 is formed over the protective film PRO. Then, an insulating film IF2 is formed over the insulating film IF1. An interlayer insulting film IL1 is configured by the insulating film IF1 and the insulating film IF2. The insulating film IF1 is formed of, for example, a silicon oxide film, and the insulating film IF2 is formed of, for example, a silicon nitride film.

The plurality of opening portions OP1 are formed in the interlayer insulting film IL1 thus configured and the protective film PRO so as to penetrate through the interlayer insulting film IL1 and the protective film PRO, and reach the respective surfaces of the plurality of unit electrodes UE1.

Plugs PLG1 are each formed within the opening portions OP1. The plug PLG1 includes a barrier conductor film BMF2 formed of a titanium/titanium nitride film which is formed on an inner wall of the opening portions OP1, and a tungsten film WF formed over the barrier conductor film BMF2 and embedded in the opening portions OP1.

Then, the source electrodes SE are formed over the interlayer insulting film IL1 in which the plugs PLG1 are formed, and the source pad SP is formed integrally with the source electrodes SE over the interlayer insulting film IL1. In this situation, the source electrodes SE are electrically connected to the plurality of unit electrodes UE1 by the plugs PLG1 formed to be embedded in the interlayer insulting film IL1. Also, the drain pad DP separated from the source electrodes SE and electrically isolated from the source electrodes SE is also formed over the interlayer insulting film IL1. The source electrodes SE, the source pad SP, and the drain pad DP are each formed of, for example, a barrier conductor film BMF3, and a metal film MF3 represented by an AlCu film formed over the barrier conductor film BMF3, or an AlSiCu film.

Thus, the power MOSFET according to the second embodiment is different from the first embodiment in which the material filled in the opening portions OP1 is the same as the material of the source electrodes SE in that, for example, the material of the source electrodes SE is different from the material of the plugs PLG1. Likewise, in the second embodiment, although not shown, for example, the material of the drain electrodes is different from the material of the plugs.

Also, in the power MOSFET according to the second embodiment, since the ohmic electrode OE1 is configured by the plurality of divided unit electrodes UE1 which are separated from each other, the same advantages as those in the first embodiment can be obtained.

(Method of Manufacturing Semiconductor Device According to Second Embodiment)

The semiconductor device (power MOSFET) according to the second embodiment is configured as described above, and a method of manufacturing the semiconductor device will be described below with reference to the drawings.

Figure 31:
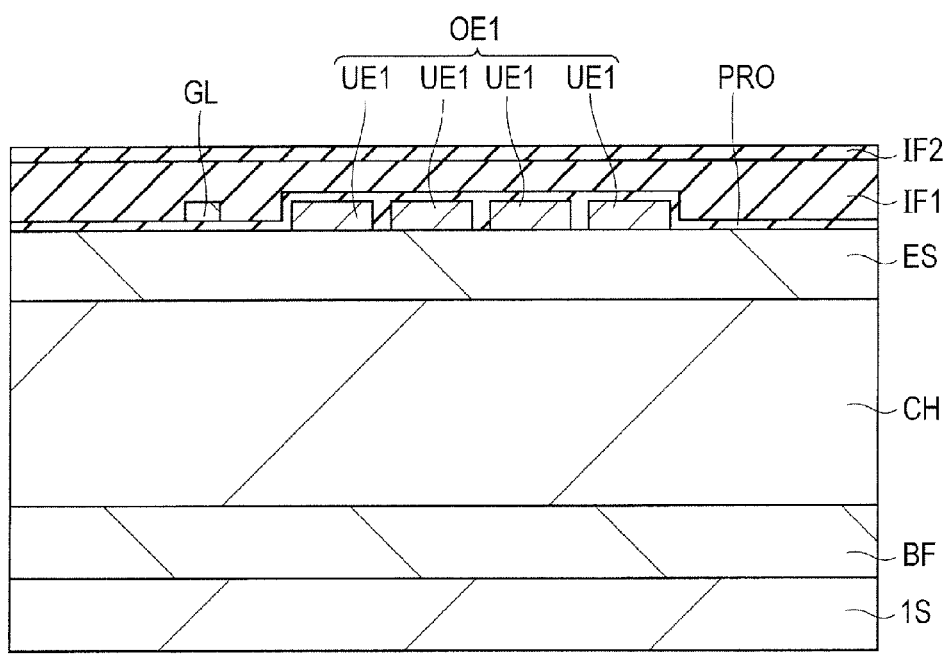
FIG. 31 is a cross-sectional view illustrating a process of manufacturing a semiconductor device according to the second embodiment.

First, the processes illustrated in FIGS. 18 to 22 are identical with those in the first embodiment. Subsequently, as illustrated in FIG. 31, the insulating film IF1 is formed over the protective film PRO, and the insulating film IF2 is formed over the insulating film IF1. The insulating film IF1 can be formed of, for example, a silicon oxide film, and formed through, for example, the CVD technique. Also, the insulating film IF2 can be formed of, for example, a silicon nitride film, and formed through, for example, the CVD technique.

Figure 32:
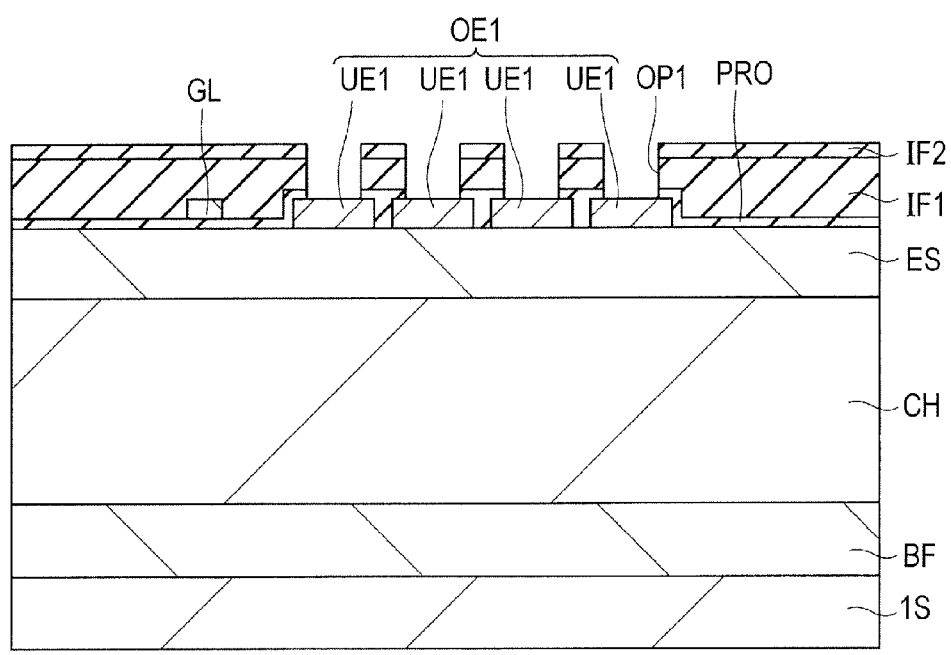
FIG. 32 is a cross-sectional view illustrating a process of manufacturing the semiconductor device subsequent to FIG. 31.

Then, as illustrated in FIG. 32, the plurality of opening portions OP1 are formed to penetrate through the insulating film IF2, the insulating film IF1, and the protective film PRO, and reach the respective surfaces of the plurality of unit electrodes UE1 through the photolithography and the etching technique.

Figure 33:
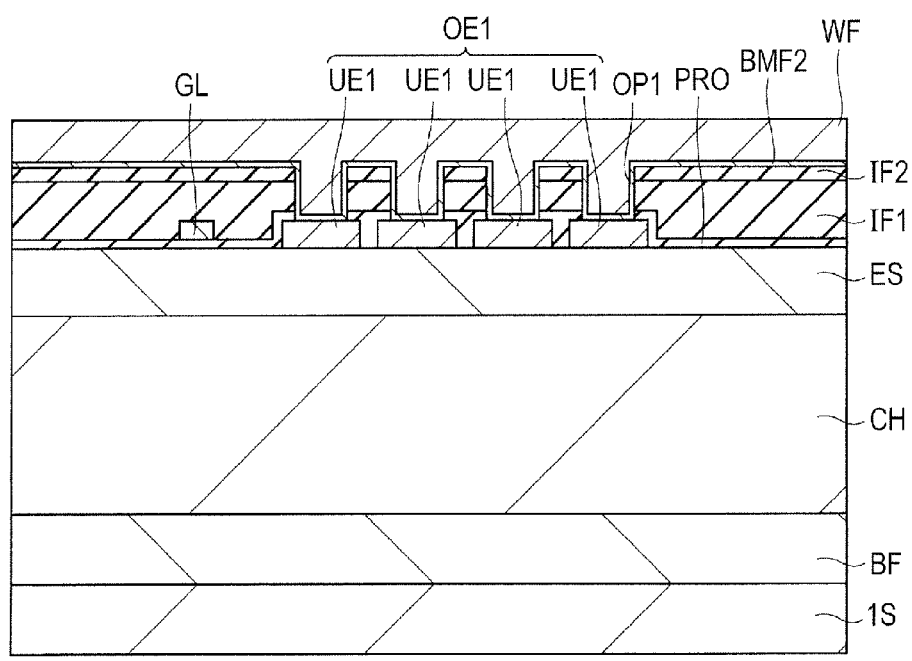
FIG. 33 is a cross-sectional view illustrating a process of manufacturing the semiconductor device subsequent to FIG. 32.

Thereafter, as illustrated in FIG. 33, the barrier conductor film BMF2 formed of, for example, a titanium/titanium nitride film is formed over the insulating film IF2 included within the opening portions OP1, and the tungsten film WF is formed over the barrier conductor film BMF2 and embedded in the opening portions OP1. The barrier conductor film BMF2 is formed through, for example, the sputtering technique, and the tungsten film WF is formed through, for example, the CVD technique.

Figure 34:
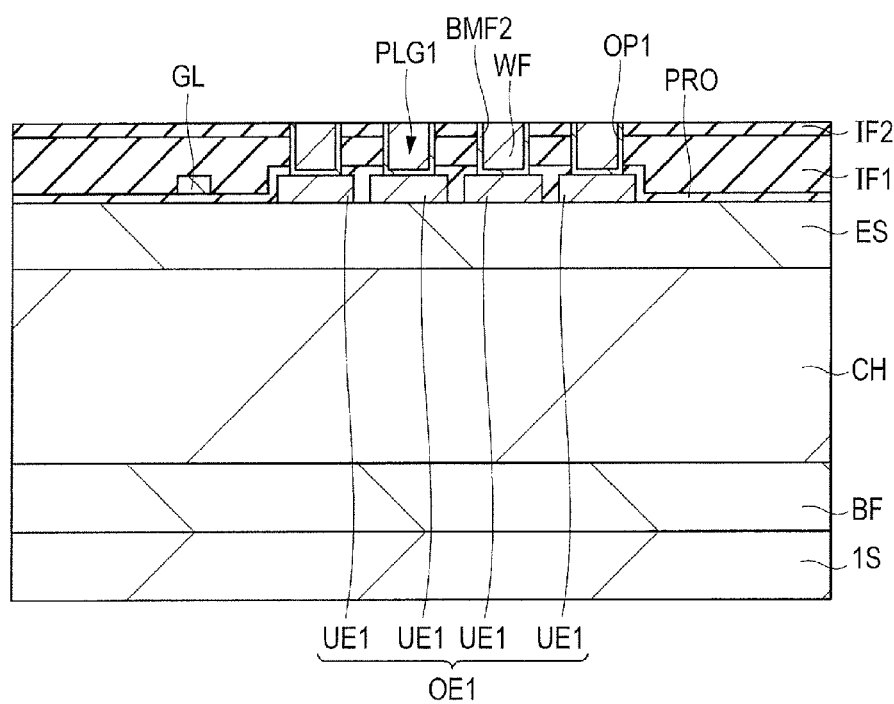
FIG. 34 is a cross-sectional view illustrating a process of manufacturing the semiconductor device subsequent to FIG. 33.
Figure 35:
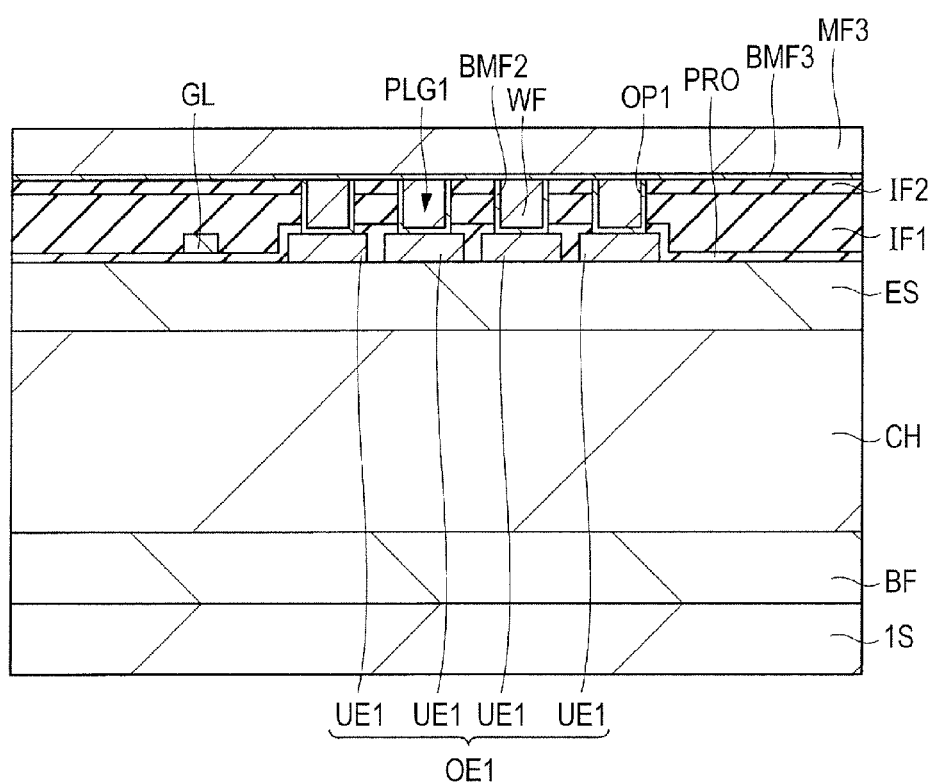
FIG. 35 is a cross-sectional view illustrating a process of manufacturing the semiconductor device subsequent to FIG. 34.

Subsequently, as illustrated in FIG. 34, the unnecessary barrier conductor film BMF2 and the unnecessary tungsten film WF, which are formed over the insulating film IF2, are removed through, for example, a chemical mechanical polishing (CMP). As a result, the barrier conductor film BMF2 and the tungsten film WF remain only in the opening portions OP1 to form the plugs PLG1. Thereafter, as illustrated in FIG. 35, the barrier conductor film BMF3 formed of, for example, a titanium/titanium nitride film is formed over the insulating film IF2 in which the plugs PLG1 are formed, and the metal film MF3 formed of, for example, an AlCu film or an AlSiCu film is formed over the barrier conductor film BMF3. In this situation, the barrier conductor film BMF3 and the metal film MF3 can be formed through, for example, the sputtering technique.

Then, the metal film MF3 and the barrier conductor film BMF3 are patterned through the photolithography and the etching technique. As a result, the source electrodes SE, the source pad SP, and the drain pad DP can be formed as illustrated in FIG. 30. With the above processes, the semiconductor device (power MOSFET) according to the second embodiment can be manufactured.

Third Embodiment

In a third embodiment, an applied example of the power MOSFET described in the first embodiment and the second embodiment will be described.

(Inverter Circuit Example)

Figure 36:
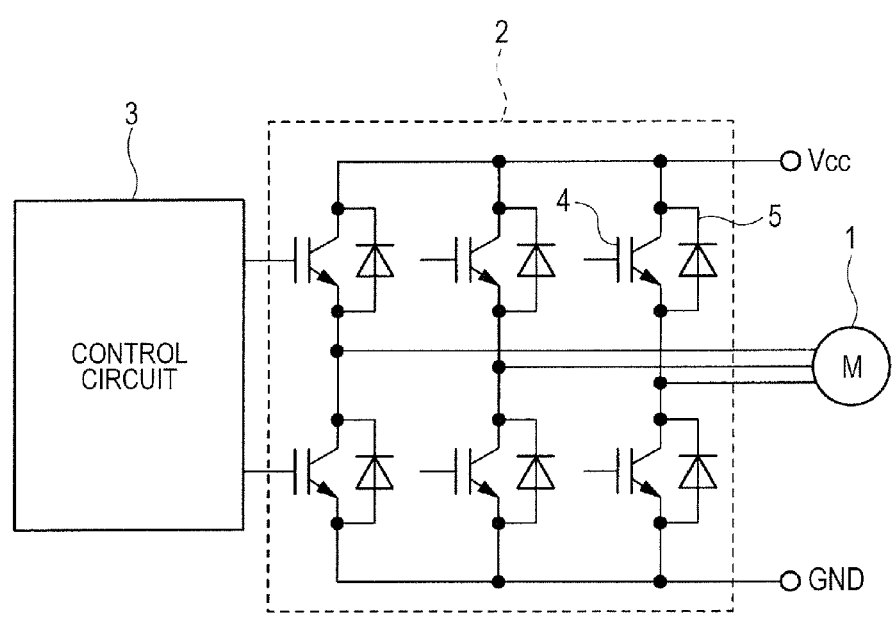
FIG. 36 is a diagram illustrating a circuit diagram of a three-phase motor according to a third embodiment.

The semiconductor device according to the third embodiment is used in a driver circuit of a three-phase motor used in, for example, a hybrid vehicle. FIG. 36 is a diagram illustrating a circuit diagram of the three-phase motor according to the third embodiment. Referring to FIG. 36, a three-phase motor circuit includes a three-phase motor 1, a power semiconductor device 2, and a control circuit 3. The three-phase motor 1 is driven by a voltage of three phases different in phase. The power semiconductor device 2 is configured by a switching element that controls the three-phase motor 1. For example, power MOSFETs 4 and diodes 5 are disposed in correspondence with, for example, three phases. That is, in each single phase, the power MOSFETs 4 and the diodes 5 are connected in antiparallel between a supply potential (Vcc) and an input potential of the three-phase motor, and the power MOSFETs 4 and the diodes 5 are also connected in antiparallel between the input potential of the three-phase motor and a ground potential (GND). That is, in the three-phase motor 1, two of the power MOSFETs 4 and two of the diodes 5 are disposed for each single phase (each phase), and six of the power MOSFETs 4 and six of the diodes 5 are disposed for three phases. Gate electrodes of the individual power MOSFETs 4 are connected with the control circuit 3 although not partially shown, and the power MOSFETs 4 are controlled by the control circuit 3. In the driver circuit of the three-phase motor thus configured, a current that flows in the power MOSFETs 4 (switching elements) configuring the power semiconductor device 2 is controlled by the control circuit 3, to thereby rotate the three-phase motor 1. That is, the power MOSFETs 4 function as the switching elements for applying the supply potential (Vcc) to the three-phase motor 1, or applying the ground potential (GND) thereto, and timing of turning on/off the power MOSFETs 4 is controlled by the control circuit 3, to thereby drive the three-phase motor 1.

The power MOSFETs 4 and the diodes 5 are connected in antiparallel as illustrated in FIG. 36, and a function of the diodes in this situation will be described.

When a load is a pure resistor with no inductance, the diodes 5 are unnecessary because there is no return energy. However, when a circuit having the inductance such as a motor (for example, three-phase motor) is connected to the load, there is a mode in which a load current flows in an opposite direction to the switch (for example, power MOSFET 4) that is on. For that reason, there is a need to connect the diodes to the switching elements such as the power MOSFETs 4 in antiparallel. That is, in the inverter circuit, when the load includes the inductance as with the motor control, when the switching element such as the power MOSFET 4 turns off, an electric energy ($\frac{1}{2}LI^2$) stored in the inductance must be discharged. Under the circumstances, in order to allow the electric energy stored in the inductance to flow back, the diodes 5 are connected in antiparallel to the power MOSFETs 4. That is, the diodes 5 have a function of allowing a reverse current to flow for the purpose of releasing the electric energy stored in the inductance.

According to the semiconductor device thus-configured in the third embodiment, the use of the power MOSFET described in the first embodiment and the second embodiment can reduce the costs and can improve the reliability of the semiconductor device.

Fourth Embodiment

A power MOSFET according to a fourth embodiment is different from the power MOSFET of the first and second embodiments in only the gate electrode structure in the X-axial direction. In FIG. 5 which is a cross-section taken along a line A-A of FIG. 3, the trench TR is formed, and the gate insulating film GOX that covers the inner wall of the trench TR, and the gate electrodes GE that come in contact with the gate insulating film GOX are formed.

Figure 37:
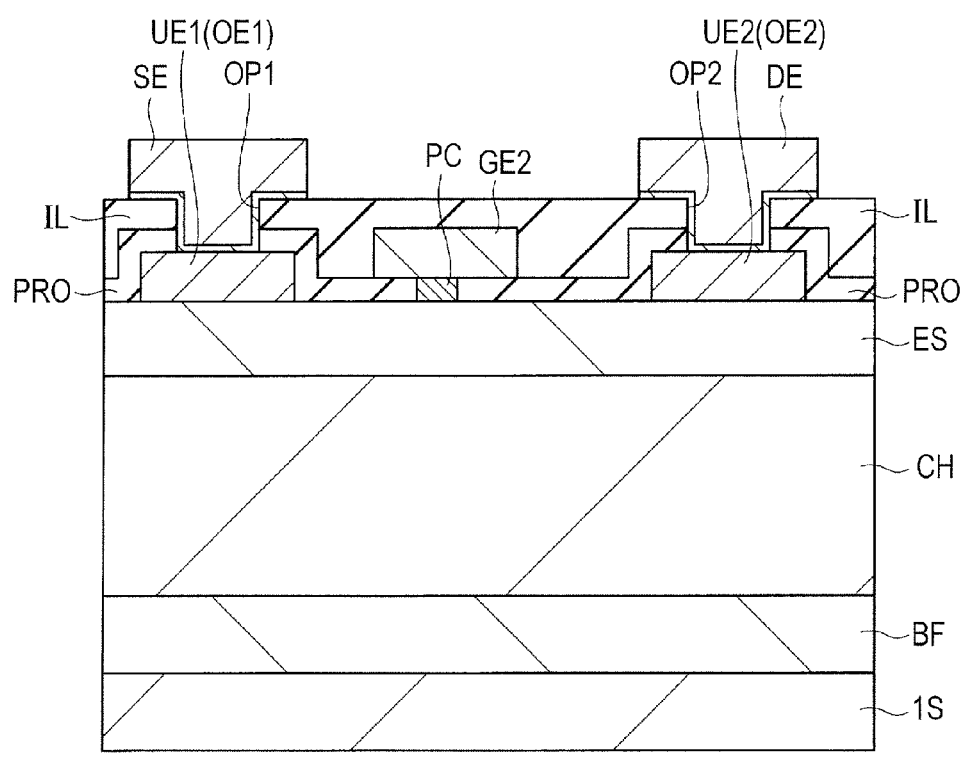
FIG. 37 is a diagram illustrating a cross-section of a power MOSFET according to a fourth embodiment.

On the other hand, in the fourth embodiment, as illustrated in FIG. 37, a p-type GaN cap layer PC is formed in contact with the electron supply layer ES, and a gate electrode GE2 is formed over the p-type GaN cap layer PC. It is desirable that the p-type GaN cap layer PC and the gate electrode GE2 are connected by Schottky connection. A gate insulating film (not shown) formed of an insulating film may be formed between the p-type GaN cap layer PC and the gate electrode GE2. In this example, it is desirable that the p-type GaN cap layer PC is formed inside the gate electrode GE2 in a plan view.

In the fourth embodiment, because the p-type GaN cap layer PC which is a p-type semiconductor layer is inserted between the gate electrode GE2 and the electron supply layer ES, a threshold voltage can be set to be positive. That is, in the fourth embodiment, because the normally-off operation can be realized without formation of the trench TR, the manufacturing costs can be reduced.

The invention made by the present inventors has been described specifically on the basis of the embodiments. However, the present invention is not limited to the above embodiments, but can be variously changed without departing from the spirit of the invention.

What is claimed is:

1. A semiconductor device including a field effect transistor, the field effect transistor comprising:
   (a) a nitride semiconductor layer;
   (b) a first ohmic electrode including a plurality of first unit electrodes, each of the first unit electrodes coming in physical and ohmic contact with the nitride semiconductor layer, the first unit electrodes being separated from each other and extending serially in a first direction along a long axis of the first unit electrodes;
   (c) a second ohmic electrode having a plurality of second unit electrodes, each of the second unit electrodes coming in physical and ohmic contact with the nitride semiconductor layer, the second unit electrodes being separated from each other and extending serially in the first direction, in which the second ohmic electrode is separated from the first ohmic electrode;
   (d) a gate electrode sandwiched between the first ohmic electrode and the second ohmic electrode and running in a direction parallel to the first ohmic electrode and the second ohmic electrode;
   (e) an insulating film formed to cover the first ohmic electrode and the second ohmic electrode;
   (f) a plurality of first opening portions that is formed in the insulating film, and reaches the respective first unit electrodes configuring the first ohmic electrode;
   (g) a plurality of second opening portions that is formed in the insulating film, and reaches the respective second unit electrodes configuring the second ohmic electrode;
   (h) a source electrode that extends from an interior of the first opening portions onto the insulating film, and is electrically connected to the first ohmic electrode; and
   (i) a drain electrode that extends from an interior of the second opening portions onto the insulating film, and is electrically connected to the second ohmic electrode, in which the drain electrode is electrically isolated from the source electrode.

2. The semiconductor device according to claim 1, wherein the first unit electrodes and the second unit electrodes each include an aluminum film.

3. The semiconductor device according to claim 1, wherein in a direction along which the electrodes are aligned, each width of the first unit electrodes is larger than each width of the first opening portions, and wherein in a direction along which the second unit electrodes are aligned, each width of the second unit electrodes is larger than each width of the second opening portions.

4. The semiconductor device according to claim 3, wherein in a plan view, the first opening portions are included in the respective first unit electrodes, and wherein in the plan view, the second opening portions are included in the respective second unit electrodes.

5. The semiconductor device according to claim 1, wherein the number of first unit electrodes is different from the number of second unit electrodes.

6. The semiconductor device according to claim 1, wherein the number of first unit electrodes is equal to the number of second unit electrodes.

7. The semiconductor device according to claim 1, wherein the first unit electrodes and the second unit electrodes each include a laminate film having an aluminum film sandwiched between titanium films.

8. The semiconductor device according to claim 1, wherein the source electrode and the drain electrode each include an aluminum alloy film.

9. The semiconductor device according to claim 8, wherein the aluminum alloy film includes one of an AlCu film and an AlSiCu film.

10. The semiconductor device according to claim 1, wherein the ohmic contact is a resistive contact having no rectification.

11. A semiconductor device including a field effect transistor, the field effect transistor comprising:
    (a) a nitride semiconductor layer;
    (b) a first ohmic electrode including a plurality of first unit electrodes, each of the first unit electrodes coming in physical and ohmic contact with the nitride semiconductor layer, the first unit electrodes being separated from each other and extending serially in a first direction along a long axis of the first unit electrodes;
    (c) a second ohmic electrode having a plurality of second unit electrodes, each of the second unit electrodes coming in physical and ohmic contact with the nitride semiconductor layer, the second unit electrodes being separated from each other and extending serially in the first direction, in which the second ohmic electrode is separated from the first ohmic electrode;

(d) a gate electrode sandwiched between the first ohmic electrode and the second ohmic electrode and running in a direction parallel to the first ohmic electrode and the second ohmic electrode;

(e) an insulating film formed to cover the first ohmic electrode and the second ohmic electrode;

(f) a plurality of first opening portions that is formed in the insulating film, and reaches the respective first unit electrodes configuring the first ohmic electrode;

(g) a plurality of second opening portions that is formed in the insulating film, and reaches the respective second unit electrodes configuring the second ohmic electrode;

(h) a plurality of first plugs embedded in each interior of the first opening portions;

(i) a source electrode which is disposed over the insulating film, and comes in contact with the first plugs;

(j) a plurality of second plugs embedded in each interior of the second opening portions; and (k) a drain electrode which is disposed over the insulating film, and comes in contact with the second plugs, in which the drain electrode is electrically isolated from the source electrode.

12. The semiconductor device according to claim 11,
wherein the first unit electrodes and the second unit electrodes each include an aluminum film.

13. The semiconductor device according to claim 11,
wherein the insulating film includes a first insulating film, and a second insulating film formed over the first insulating film.

14. The semiconductor device according to claim 13,
wherein the first insulating film is a silicon oxide film, and wherein the second insulating film is a silicon nitride film.

15. The semiconductor device according to claim 11,
wherein a material of the first plugs is different from a material of the source electrode, and
wherein a material of the second plugs is different from a material of the drain electrode.

16. A semiconductor device, comprising:

(a) a source electrode having a source pad and a plurality of source comb shaped electrodes protruded from the source pad in a first direction;

(b) a drain electrode having a drain pad, and a plurality of drain comb shaped electrodes protruded from the drain pad in the first direction, in which the source comb shaped electrodes and the drain comb shaped electrodes are alternately arranged along a second direction orthogonal to the first direction;

(c) a plurality of gate electrodes sandwiched between the respective source comb shaped electrodes and the respective drain comb shaped electrodes;

(d) an insulating film disposed over lower layers of the respective source comb shaped electrodes so as to provide a plurality of first opening portions along the first direction, and disposed over lower layers of the respective drain comb shaped electrodes so as to provide a plurality of second opening portions along the first direction;

(e) a plurality of first plugs embedded in respective interiors of the first opening portions, and electrically connected to the respective source comb shaped electrodes;

(f) a plurality of second plugs embedded in respective interiors of the second opening portions, and electrically connected to the respective drain comb shaped electrodes;

(g) a plurality of first unit electrodes disposed over lower layers of the respective first plugs arranged along the first direction, electrically connected to the respective first plugs arranged along the first direction, and separated from each other in the first direction and extending serially in the first direction along a long axis of the first unit electrodes, for each of the source comb shaped electrodes;

(h) a plurality of second unit electrodes disposed over lower layers of the respective second plugs arranged along the first direction, electrically connected to the respective second plugs arranged along the first direction and extending serially in the first direction, and separated from each other in the first direction, for each of the drain comb shaped electrodes; and (i) a nitride semiconductor layer disposed over lower layers of first unit electrodes and the second unit electrodes, and coming in physical and ohmic contact with the first unit electrodes and the second unit electrodes.

17. The semiconductor device according to claim 16,
wherein the first unit electrodes and the second unit electrodes each include an aluminum film,
wherein a width of the respective source comb shaped electrodes in the second direction is equal to a width of the respective drain comb shaped electrodes in the second direction, and
wherein the number of first unit electrodes is equal to the number of second unit electrodes.

18. The semiconductor device according to claim 16,
wherein the first unit electrodes and the second unit electrodes each include an aluminum film,
wherein a width of the respective source comb shaped electrodes in the second direction is smaller than a width of the respective drain comb shaped electrodes in the second direction, and
wherein the number of first unit electrodes is larger than the number of second unit electrodes.

19. The semiconductor device according to claim 16,
wherein the first unit electrodes and the second unit electrodes each include an aluminum film,
wherein a width of the respective source comb shaped electrodes in the second direction is larger than a width of the respective drain comb shaped electrodes in the second direction, and
wherein the number of first unit electrodes is smaller than the number of second unit electrodes.

20. The semiconductor device according to claim 1, where the number of the plurality of first unit electrodes is four, and the number of the plurality of second unit electrodes is four.

* * * * *